US012672387B2

(12) United States Patent (10) Patent No.: US 12,672,387 B2
Yoshida et al. (45) Date of Patent: Jun. 30, 2026

(54) PRESSURE DETECTION METHOD, PRESSURE DETECTION METHOD OF BONDING DEVICE USING THE SAME, AND BONDING SYSTEM INCLUDING THE SAME

(71) Applicant: Samsung Display Co., LTD., Yongin-si (KR)

(72) Inventors: Futoshi Yoshida, Yongin-si (KR); Jong Hyup Kim, Yongin-si (KR); Jin Pyung Lee, Yongin-si (KR); Chung Sic Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 361 days.

(21) Appl. No.: 18/481,568

(22) Filed: Oct. 5, 2023

(65) Prior Publication Data

US 2024/0313153 A1 Sep. 19, 2024

(30) Foreign Application Priority Data

Mar. 13, 2023 (KR) ........................ 10-2023-0032727

(51) Int. Cl.
*H10H 20/01* (2025.01)
*G01L 1/24* (2006.01)
(Continued)

(52) U.S. Cl.
CPC .............. *H10H 20/01* (2025.01); *G01L 1/24* (2013.01); *G01L 1/247* (2013.01); *G06T 7/62* (2017.01);
(Continued)

(58) Field of Classification Search
CPC ........... G01B 11/28; G01L 1/24; G01L 1/247; G06T 7/62; G06T 7/90;
(Continued)

(56) References Cited

U.S. PATENT DOCUMENTS 4,002,060 A * 1/1977 Ogata ...................... B01J 13/02
73/762
4,003,245 A * 1/1977 Ogata ...................... B01J 13/02
73/818
(Continued)

FOREIGN PATENT DOCUMENTS

JP 5020037 9/2012
JP 6308431 4/2018
(Continued)

*Primary Examiner* — Earl N Taylor
(74) *Attorney, Agent, or Firm* — CANTOR COLBURN LLP

(57) ABSTRACT

The disclosure provides a pressure detection method of a bonding device and a bonding system. The pressure detection method of a bonding device includes forming a backplane substrate including a light emitting element, disposing a pressure detection sheet on the backplane substrate, transferring the backplane substrate and the pressure detection sheet into a chamber, bonding the light emitting element by pressurizing the pressure detection sheet, photographing the pressure detection sheet, and detecting a color developing area of the pressure detection sheet. In the pressure detection method of the bonding device and the bonding system, it can be inspected whether uniform pressure is applied to a pressure detection sheet.

20 Claims, 24 Drawing Sheets

(51) Int. Cl.

| | |
|---|---|
| *G06T 7/62* | (2017.01) |
| *G06T 7/90* | (2017.01) |
| *H10H 20/857* | (2025.01) |
| *H10W 72/00* | (2026.01) |
| *H10W 90/00* | (2026.01) |

(52) U.S. Cl.
CPC ............. *G06T 7/90* (2017.01); *H10H 20/857* (2025.01); *H10W 90/00* (2026.01); *G06T 2207/10024* (2013.01); *G06T 2207/10056* (2013.01); *G06T 2207/30148* (2013.01); *H10H 20/0364* (2025.01); *H10W 72/07141* (2026.01); *H10W 72/07183* (2026.01); *H10W 72/07307* (2026.01); *H10W 72/07332* (2026.01); *H10W 90/734* (2026.01)

(58) Field of Classification Search
CPC . G06T 2207/10024; G06T 2207/10056; G06T 2207/30148; H10W 90/00; H10W 72/07141; H10W 72/07183; H10W 72/07307; H10W 72/07332; H10W 90/734; H10H 20/01; H10H 20/0364; H10H 20/857; H01L 24/32; H01L 24/75; H01L 24/83; H01L 25/0753; H01L 24/97; H01L 2224/753; H01L 2224/759; H01L 2924/12041
See application file for complete search history.

(56) References Cited

U.S. PATENT DOCUMENTS

| | | | | |
|---|---|---|---|---|
| 4,132,112 | A * | 1/1979 | Hosoi | B01J 13/02 |
| | | | | 503/200 |
| 4,402,326 | A * | 9/1983 | Okano | A61C 19/05 |
| | | | | 600/587 |
| 5,395,239 | A * | 3/1995 | Komatsu | A61C 19/05 |
| | | | | 433/68 |
| 5,458,487 | A * | 10/1995 | Komatsu | A61C 9/0053 |
| | | | | 600/590 |
| 7,190,440 | B2 * | 3/2007 | Ng | G01L 1/247 |
| | | | | 73/762 |
| 2020/0096401 | A1 * | 3/2020 | Kato | G01L 1/247 |
| 2023/0132423 | A1 * | 5/2023 | Chen | H10H 20/856 |
| | | | | 257/89 |
| 2023/0163262 | A1 * | 5/2023 | Antoniadis | H01L 25/0753 |
| | | | | 257/89 |
| 2024/0038822 | A1 * | 2/2024 | Choi | H10H 29/142 |
| 2024/0105525 | A1 * | 3/2024 | Hashim | G09G 3/32 |
| 2024/0243067 | A1 * | 7/2024 | Fan | H10W 70/611 |
| 2025/0022836 | A1 * | 1/2025 | Lin | H01L 25/167 |
| 2025/0022861 | A1 * | 1/2025 | Park | B60Q 1/268 |
| 2025/0040292 | A1 * | 1/2025 | Kim | H10H 20/01 |

FOREIGN PATENT DOCUMENTS

| | | | | |
|---|---|---|---|---|
| JP | 7124219 | | 8/2022 | |
| JP | 2024047883 A | * | 4/2024 | |
| WO | WO-2022113777 A1 | * | 6/2022 | C09J 201/00 |

* cited by examiner

PAD

PRESSURE DETECTION METHOD, PRESSURE DETECTION METHOD OF BONDING DEVICE USING THE SAME, AND BONDING SYSTEM INCLUDING THE SAME

CROSS REFERENCE TO RELATED APPLICATION(S)

This application claims priority to and benefits of Korean Patent Application No. 10-2023-0032727 under 35 U.S.C. § 119, filed on Mar. 13, 2023, in the Korean Intellectual Property Office (KIPO), the entire contents of which are incorporated herein by reference.

BACKGROUND

1. Technical Field

The disclosure relates to a pressure detection method, a pressure detection method of a bonding device using the same, and a bonding system including the same.

2. Description of the Related Art

With the development of information technologies, the importance of a display device which is a connection medium between a user and information increases. Accordingly, display devices such as a liquid crystal display device, an organic light emitting display device, an inorganic light emitting display device, and the like are increasingly used.

For example, a display panel is formed by transferring a light emitting element on a substrate having a thin film transistor formed on a substrate, and a display device including the display panel is used.

A process of bonding the light emitting element may be performed to reduce an electrical resistance in an area in which the thin film transistor and the light emitting element are connected to each other in a process of manufacturing the display panel.

SUMMARY

The disclosure provides a pressure detection method, a pressure detection method of a bonding device using the same, and a bonding system including the same, which can inspect whether a uniform pressure is applied to a pressure detection sheet.

According to an embodiment, a pressure detection method of a bonding device may include forming a backplane substrate including a light emitting element, disposing a pressure detection sheet on the backplane substrate, transferring the backplane substrate and the pressure detection sheet into a chamber, bonding the light emitting element by pressurizing the pressure detection sheet, photographing the pressure detection sheet, and detecting a color developing area of the pressure detection sheet.

The photographing of the pressure detection sheet may include applying a force to the pressure detection sheet in a direction to increase an area of the pressure detection sheet, and photographing the pressure detection sheet having the increased area.

In the applying of the force to the pressure detection sheet, the force may be uniformly applied to sides of the pressure detection sheet, which face each other.

The photographing of the pressure detection sheet may include setting an area of the pressure detection sheet, and photographing the area by using a microscope of which a resolution power is set to less than or equal to about 2 μm.

In the photographing of the area by using the microscope of which the resolution power is set to less than or equal to about 2 μm, a magnification of the microscope may be set to about 500 times, and a photographing resolution may be equal to or greater than about 300,000 pixels.

The detecting of the color developing area may include acquiring an image of an area of the pressure detection sheet, detecting, in the image, the color developing area color-developed by a color component and a peripheral area which is not color-developed, setting a plurality of detection pixels by splitting the image, and detecting a color pixel having a ratio of the color developing area equal to or greater than a predetermined ratio among the plurality of detection pixels.

The predetermined ratio may be equal to or greater than about 10%.

The pressure detection sheet may include a first sheet including a color capsule, and a second sheet including a color developer. In the bonding of the light emitting element by pressurizing the pressure detection sheet, a color component of the color capsule may be mixed with the color developer.

The photographing of the pressure detection sheet may include separating the first sheet and the second sheet from each other, and photographing a surface of the second sheet.

The forming of the backplane substrate may include disposing a thin film transistor substrate, and transferring the light emitting element on the thin film transistor substrate.

The forming of the backplane substrate may further include disposing a conductive material on the thin film transistor substrate.

The transferring of the light emitting element may include providing a carrier substrate including the light emitting element, and approaching the carrier substrate including the light emitting element to the backplane substrate.

The light emitting element may be a micro light emitting diode.

According to an embodiment, a bonding system may include a chamber having a space, a stage located in the chamber, the stage on which a backplane substrate including a light emitting element is mounted a pressure detection sheet disposed on the light emitting element of the backplane substrate, a pressurizing member located in the chamber and pressurizing the pressure detection sheet, a pressurization source supplying a gas into the chamber and providing air pressure to the pressurizing member, and an image capturing device photographing the pressure detection sheet and detecting a color developing area of the pressure detection sheet.

The bonding system may further include a heat source irradiating light toward the stage.

The image capturing device may include a microscope with a resolution power set to less than or equal to about 2 μm.

The image capturing device may acquire an image of an area of the pressure detection sheet, detect, in the image, the color developing area color-developed by a color component and a peripheral area which is not color-developed, set a plurality of detection pixels by splitting the image, and detect color pixels having a ratio of the color developing area is equal to or greater than a predetermined ratio among the plurality of detection pixels.

The backplane substrate may further include a thin film transistor substrate including the light emitting element and at least one transistor, and a conductive material interposed between the thin film transistor substrate and the light emitting element.

According to an embodiment, a pressure detection method including pressurizing a pressure detection sheet, photographing the pressure detection sheet, acquiring an image of an area of the pressure detection sheet, detecting, in the image, a color developing area color-developed by a color component and a peripheral area which is not color-developed, setting a plurality of detection pixels by splitting the image, detecting a number of color pixels having a ratio of the color developing area equal to or greater than a predetermined ratio among the plurality of detection pixels, and detecting an area of the pressure detection sheet, based on the number of the color pixels.

The photographing of the pressure detection sheet may include applying a force to the pressure detection sheet in a direction to increase an area of the pressure detection sheet, and photographing the pressure detection sheet having the increased area.

BRIEF DESCRIPTION OF THE DRAWINGS

The disclosure will now be described more fully herein-after with reference to the accompanying drawings, how-ever, they may be embodied in different forms and should not be construed as limited to the embodiments set forth herein. Rather, these embodiments are provided so that this disclosure will be more thorough and complete, and will fully convey the scope of the disclosure to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 4 is a schematic cross-sectional view illustrating the display device taken along line A-A' of FIG. 3 in accordance with embodiments of the disclosure.

FIG. 6 is a schematic enlarged plan view illustrating area AR1 of FIG. 5.

FIG. 7 is a schematic cross-sectional view illustrating the tiled display device taken along line B-B' of FIG. 6 in accordance with embodiments of the disclosure.

FIG. 8 is a schematic enlarged plan view illustrating area AR2 of FIG. 5.

FIG. 9 is a schematic cross-sectional view illustrating the tiled display device taken along line F-F' of FIG. 8 in accordance with embodiments of the disclosure.

Figure 1:
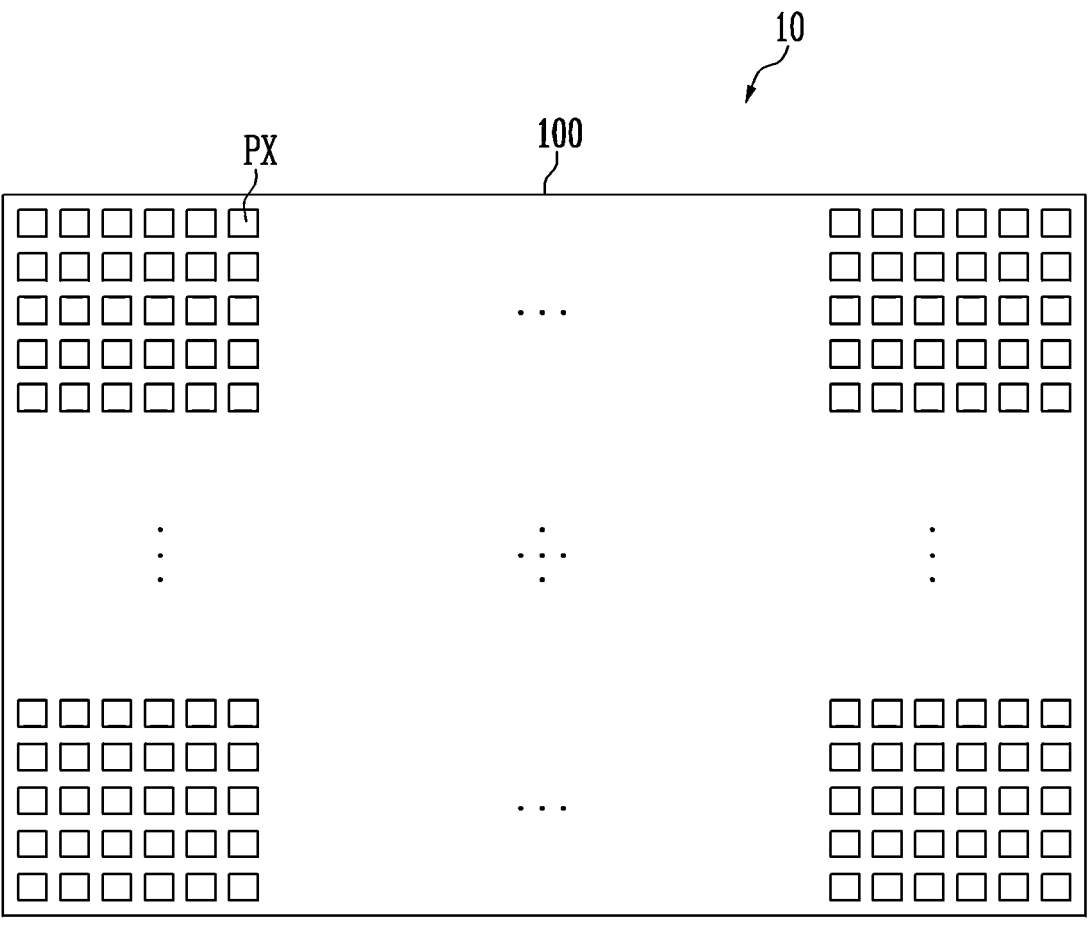
FIG. 1 is a schematic plan view illustrating a display device in accordance with embodiments of the disclosure.
Figure 1:
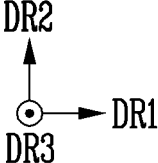

DETAILED DESCRIPTION OF THE
EMBODIMENTS

In the following description, for the purposes of expla-nation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or imple-mented in another embodiment.

Hereinafter, embodiments are described in detail with reference to the accompanying drawings so that those skilled in the art may readily practice the disclosure. The disclosure may be implemented in various different forms and is not limited to the embodiments described in the specification.

The terminology used herein is for the purpose of describ-ing particular embodiments and is not intended to be limit-ing. A part irrelevant to the description will be omitted to clearly describe the disclosure, and the same or similar constituent elements will be designated by the same refer-ence numerals throughout the specification. Therefore, the same reference numerals may be used in different drawings to identify the same or similar elements.

As used herein, the singular forms, "a," "an," and "the" are intended to include the plural forms as well, unless the context clearly indicates otherwise. Moreover, the terms "comprises," "comprising," "includes," "including," "has," and/or "having," when used in this specification, specify the presence of stated features, integers, steps, operations, ele-ments, components, and/or groups thereof, but do not pre-clude the presence or addition of one or more other features, integers, steps, operations, elements, components, and/or groups thereof.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

When an element, such as a layer, is referred to as being "on" or "connected to" another element or layer, it may be directly on or connected to the other element or layer or intervening elements or layers may be present. When, however, an element or layer is referred to as being "directly on" or "directly connected to" another element or layer, there are no intervening elements or layers present. To this end, the term "connected" may refer to physical, electrical, and/or fluid connection, with or without intervening elements. Further, the first direction DR1, the second direction DR2, and the third direction DR3 are not limited to three axes of a rectangular coordinate system, such as the x, y, and z axes, and may be interpreted in a broader sense. For example, the first direction DR1, the second direction DR2, and the third direction DR3 may be perpendicular to one another, or may represent different directions that are not perpendicular to one another. For the purposes of this disclosure, "at least one of X, Y, and Z" may be construed as X only, Y only, Z only, or any combination of two or more of X, Y, and Z, such as, for instance, XYZ, XYY, YZ, and ZZ.

In description, the expression "equal" may mean "substantially equal." That is, this may mean equality to a degree to which those skilled in the art can understand the equality. Other expressions may be expressions in which "substantially" is omitted. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Spatially relative terms, such as "below," "under," "lower," "above," "upper," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

Throughout the specification, when an element is referred to as being "connected" to another element, the element may be "directly connected" to another element, or "electrically connected" to another element with one or more intervening elements interposed therebetween. Also, when an element is referred to as being "in contact" or "contacted" or the like to another element, the element may be in "electrical contact" or in "physical contact" with another element; or in "indirect contact" or in "direct contact" with another element.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some example embodiments may be physically separated into two or more interacting and discrete blocks, units, and/or modules without departing from the scope of the disclosure. Further, the blocks, units, and/or modules of some example embodiments may be physically combined into more complex blocks, units, and/or modules without departing from the scope of the disclosure.

Unless otherwise specified, the illustrated embodiments are to be understood as providing example features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, the size and thickness of each component illustrated in the drawings are arbitrarily shown for better understanding and ease of description, but the disclosure is not limited thereto. Thicknesses of several portions and regions are exaggerated for clear expressions. When an embodiment may be implemented differently, a specific process order may be performed differently from the described order. For example, two consecutively described processes may be performed substantially at the same time or performed in an order opposite to the described order.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

The display surface may be parallel to a surface defined by a first direction DR1 and a second direction DR2. A normal direction of the display surface, i.e., a thickness direction of the display device 10, may indicate a third direction DR3. In this specification, an expression of "when viewed from the top, in a third direction DR3, or in a plan view" may represent a case when viewed in the third direction DR3. Hereinafter, a front surface (or a top surface) and a rear surface (or a bottom surface) of each of layers or units may be distinguished by the third direction DR3. However, directions indicated by the first to third directions DR1, DR2, and DR3 may be a relative concept, and converted with respect to each other, e.g., converted into opposite directions.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described in detail with reference to the accompanying drawings.

Figure 2:
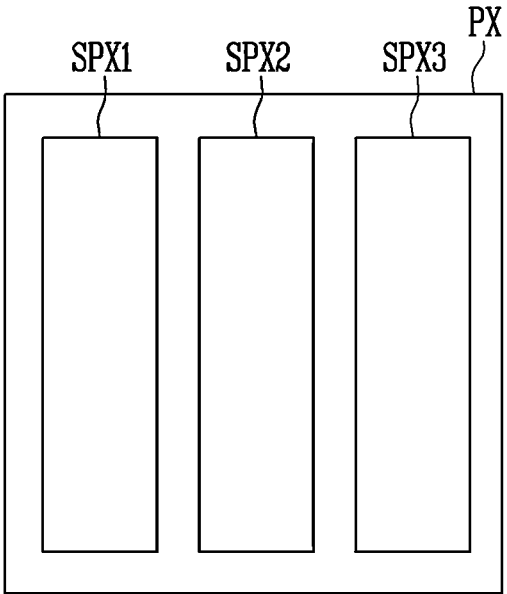
FIG. 2 is a schematic plan view illustrating an embodi-ment of a pixel of FIG. 1.
Figure 2:
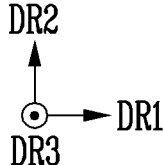
Figure 3:
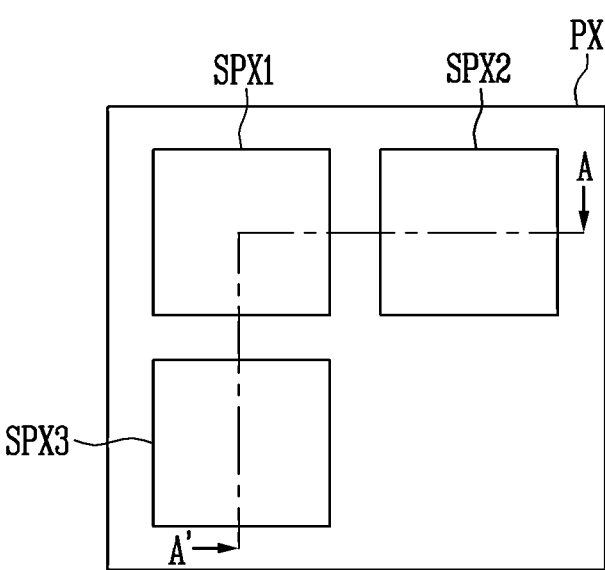
FIG. 3 is a schematic plan view illustrating another embodiment of a pixel of FIG. 1.
Figure 3:
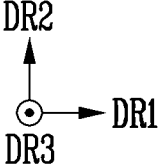

FIG. 1 is a schematic plan view illustrating a display device 10 in accordance with embodiments of the disclosure. FIG. 2 is a schematic plan view illustrating an embodiment of a pixel PX of FIG. 1. FIG. 3 is a schematic plan view illustrating another embodiment of a pixel PX of FIG. 1.

Referring to FIG. 1, the display device 10 may be a device which displays a moving image or a still image, and may be used as a display screen of not only portable electronic devices such as a mobile phone, a smart phone, a tablet personal computer (PC), a smart watch, a watch phone, a mobile communication terminal, an electronic notebook, an electronic book, a portable multimedia player (PMP), a navigation system, an ultra-mobile PC (UMPC), and the like, but also various products such as a television, a notebook computer, a monitor, an advertisement board, Internet of things (IoT), and the like.

A display panel 100 may be formed in a rectangular shape having long sides in a first direction DR1 and short sides in a second direction DR2 intersecting the first direction DR1 in a plan view. A corner at which the long side in the first direction DR1 and the short side in the second direction DR2 meet may be formed round and have a curvature or be formed at a right angle. The display panel 100 may be formed in a polygonal shape, a circular shape, an elliptical shape, or the like in a plan view. For example, a shape of the display panel 100 may be a quadrangular in a plan view. However, the shape of the display panel 100 is not limited thereto. The display panel 100 may be formed flat, but the disclosure is not limited thereto. For example, the display panel 100 may include a curved part which is formed at an end portion (e.g., a left and/or right end portion) and has a curvature (e.g., a constant curvature or a changing curvature). The display panel 100 may be formed flexible and may be warpable, curvable, bendable, foldable, rollable, or the like.

The display panel 100 may further include pixels PX for displaying an image, multiple scan lines (not shown) extending in a direction (e.g., the first direction DR1), and multiple data lines (not shown) extending in another direction (e.g., the second direction DR2). The pixels PX may be arranged in a matrix form in the first direction DR1 and the second direction DR2. The first direction DR1 and the second direction DR2 may be directions orthogonal to each other (e.g., an x-axis in a horizontal direction and a y-axis in a vertical direction), but the disclosure is not limited thereto.

Each of the pixels PX may include multiple sub-pixels SPX1, SPX2, and SPX3 as shown in FIGS. 2 and 3. FIGS. 2 and 3 illustrate that the pixel PX includes three sub-pixels SPX1, SPX2, and SPX3, i.e., a first sub-pixel SPX1, a second sub-pixel SPX2, and a third sub-pixel SPX3. However, the disclosure is not limited thereto.

Each of the first sub-pixel SPX1, the second sub-pixel SPX2, and the third sub-pixel SPX3 may be electrically connected to at least one of the data lines, and be electrically connected to at least one of the scan lines.

Each of the first sub-pixel SPX1, the second sub-pixel SPX2, and the third sub-pixel SPX3 may have a rectangular shape, a square shape, a rhombic shape, or the like in a plan view. For example, each of the first sub-pixel SPX1, the second sub-pixel SPX2, and the third sub-pixel SPX3 may have a rectangular shape in a plan view having short sides in the first direction DR1 and long sides in the second direction DR2 as shown in FIG. 2. In another embodiment, each of the first sub-pixel SPX1, the second sub-pixel SPX2, and the third sub-pixel SPX3 may have a square or a rhombic shape including sides having a same length in the first direction DR1 and the second direction DR2 as shown in FIG. 3.

As shown in FIG. 2, the first sub-pixel SPX1, the second sub-pixel SPX2, and the third sub-pixel SPX3 may be arranged in the first direction DR1. In another embodiment, the first sub-pixel SPX1 and one of the second sub-pixel SPX2 and the third sub-pixel SPX3 may be arranged in the first direction DR1, and the first sub-pixel SPX1 and another one of the second sub-pixel SPX2 and the third sub-pixel SPX3 may be arranged in the second direction DR2. For example, as shown in FIG. 3, the first sub-pixel SPX1 and the second sub-pixel SPX2 may be arranged in the first direction DR1, and the first sub-pixel SPX1 and the third sub-pixel SPX3 may be arranged in the second direction DR2.

In another embodiment, the second sub-pixel SPX2 and one of the first sub-pixel SPX1 and the third sub-pixel SPX3 may be arranged in the first direction DR1, and the second sub-pixel SPX2 and another one of the first sub-pixel SPX1 and the third sub-pixel SPX3 may be arranged in the second direction DR2. In another embodiment, the third sub-pixel SPX3 and one of the first sub-pixel SPX1 and the second sub-pixel SPX2 may be arranged in the first direction DR1, and the third sub-pixel SPX3 and another one of the first sub-pixel SPX1 and the second sub-pixel SPX2 may be arranged in the second direction DR2.

The first sub-pixel SPX1 may emit first light, the second sub-pixel SPX2 may emit second light, and the third sub-pixel SPX3 may emit third light. The first light may be light in a red wavelength band, the second light may be light in a green wavelength band, and the third light may be light in a blue wavelength band. The red wavelength band may be a wavelength band in a range of about 600 nm (nanometer) to about 750 nm, the green wavelength band may be a wavelength band in a range of about 480 nm to about 560 nm, and the blue wavelength band may be a wavelength band in a range of about 370 nm to about 460 nm. However, the disclosure is not limited thereto.

Each of the first sub-pixel SPX1, the second sub-pixel SPX2, and the third sub-pixel SPX3 may include an inorganic light emitting element having an inorganic semiconductor as a light emitting element emitting light. For example, the inorganic light emitting element may be a flip chip type micro light emitting diode (LED) (hereinafter, also referred to as a micro LED), but the disclosure is not limited thereto.

As shown in FIGS. 2 and 3, an area of the first sub-pixel SPX1, an area of the second sub-pixel SPX2, and an area of the third sub-pixel SPX3 may be the substantially same, but the disclosure is not limited thereto. At least one of the area of the first sub-pixel SPX1, the area of the second sub-pixel SPX2, and the area of the third sub-pixel SPX3 and another one of the area of the first sub-pixel SPX1, the area of the second sub-pixel SPX2, and the area of the third sub-pixel SPX3 may be different from each other. In another embodiment, at least two of the area of the first sub-pixel SPX1, the area of the second sub-pixel SPX2, and the area of the third sub-pixel SPX3 may be the substantially same, and another one of the first sub-pixel SPX1, the area of the second sub-pixel SPX2, and the area of the third sub-pixel SPX3 and the at least two of the area of the first sub-pixel SPX1, the area of the second sub-pixel SPX2, and the area of the third sub-pixel SPX3 may be different from each other. In another embodiment, the area of the first sub-pixel SPX1, the area of the second sub-pixel SPX2, and the area of the third sub-pixel SPX3 may be different from one another.

Figure 4:
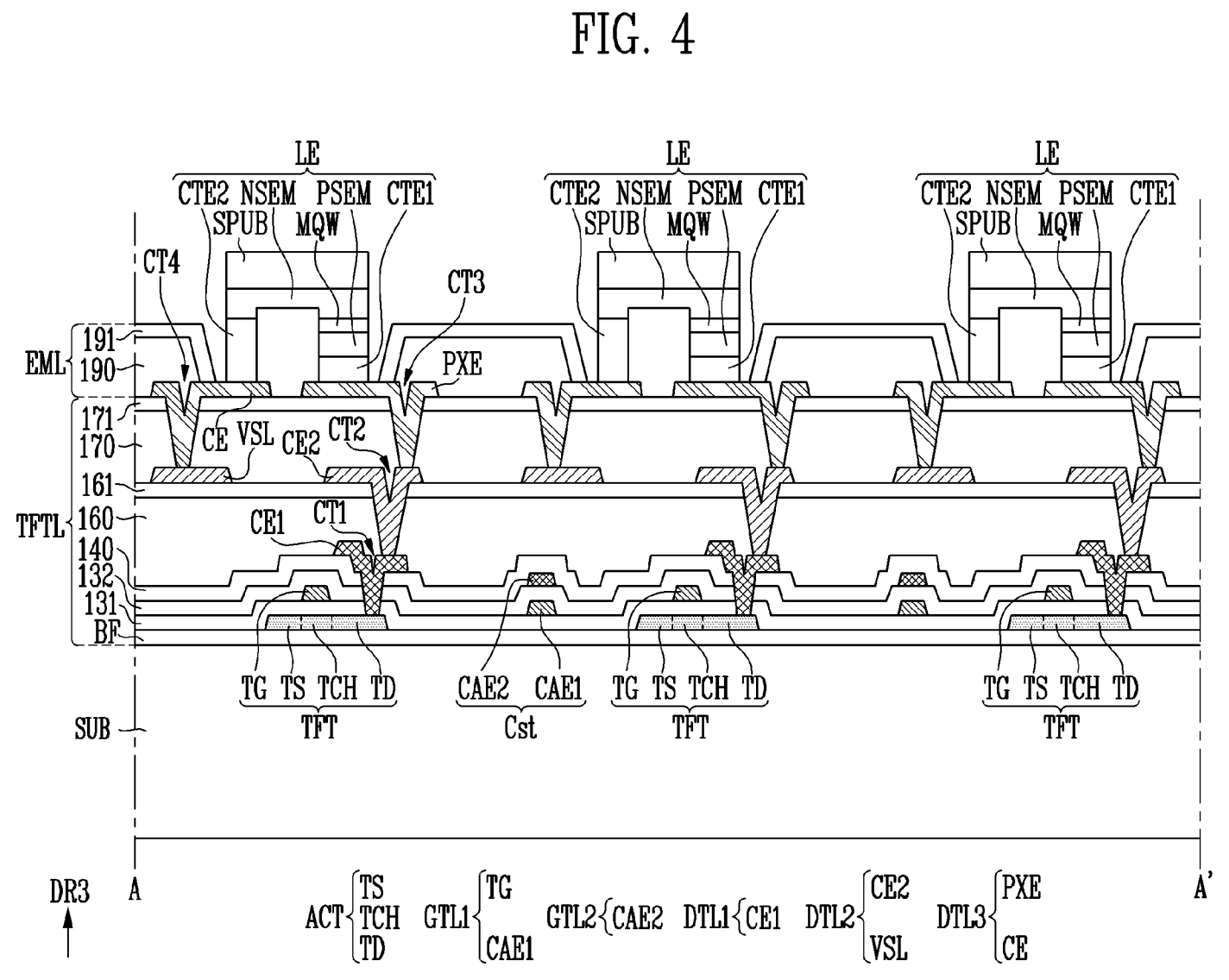

FIG. 4 is a schematic cross-sectional view illustrating the display device 10 taken along line A-A' of FIG. 3 in accordance with embodiments of the disclosure.

Referring to FIG. 4, a thin film transistor layer TFTL may be disposed on a substrate SUB. The thin film transistor layer TFTL may be a layer in which a thin film transistor TFT is formed. The thin film transistor layer TFTL may include at least one transistor (e.g., the thin film transistor TFT).

The thin film transistor layer TFTL may include an active layer ACT, a first gate layer GTL1, a second gate layer GTL2, a first data metal layer DTL1, and a second data metal layer DTL2. Also, the thin film transistor layer TFTL may include a buffer layer BF, a first gate insulating layer 131, a second gate insulating layer 132, an interlayer insulating layer 140, a first planarization layer 160, a first insulating layer 161, a second planarization layer 170, a second insulating layer 171, and the like.

The substrate SUB may be a base substrate, a base member, or the like, which supports the display device 10 (see, e.g., FIG. 1). The substrate SUB may be a rigid substrate made of glass or the like. In another embodiment, the substrate SUB may be a flexible substrate which is warpable, curvable, bendable, foldable, rollable, or the like. The substrate SUB may include an insulating material such as a polymer resin including polyimide (PI) or the like.

The buffer layer BF may be disposed on a surface of the substrate SUB. The buffer layer BF may be a layer for preventing infiltration of air, moisture, and/or the like. The buffer layer BF may include multiple inorganic layers which are alternately stacked each other. For example, the buffer layer BF may be formed as a multi-layer of inorganic layers including a silicon nitride layer, a silicon oxynitride layer, a silicon oxide layer, a titanium oxide layer, or an aluminum oxide layer. In an embodiment, the buffer layer BF may be omitted.

The active layer ACT may be disposed on the buffer layer BF. The active layer ACT may include a silicon semiconductor such as polycrystalline silicon, single crystalline silicon, low temperature polycrystalline silicon, amorphous silicon, the like, or a combination thereof, or include an oxide semiconductor or the like.

The active layer ACT may include a channel TCH, a first electrode TS, and a second electrode TD of the thin film transistor TFT. The channel TCH of the thin film transistor TFT may be a region overlapping a gate electrode TG of the thin film transistor TFT in a third direction DR3 as a thickness direction of the substrate SUB. The third direction DR3 may intersect the first direction DR1 and the second direction DR2. The first electrode TS of the thin film transistor TFT may be disposed at (or adjacent to) a side of the channel TCH, and the second electrode TD of the thin film transistor TFT may be disposed at (or adjacent to) another side of the channel TCH. The first electrode TS and the second electrode TD of the thin film transistor TFT may be regions not overlapping the gate electrode TG in the third direction DR3. The first electrode TS and the second electrode TD of the thin film transistor TFT may be regions having conductivity as ions are doped into a semiconductor (e.g., a silicon semiconductor, an oxide semiconductor, or the like).

The first gate insulating layer 131 may be disposed on the active layer ACT. The first gate insulating layer 131 may be formed of an inorganic layer, for example, a silicon nitride layer, a silicon oxynitride layer, a silicon oxide layer, a titanium oxide layer, an aluminum oxide layer, the like, or a combination thereof.

The first gate layer GTL1 may be disposed on the first gate insulating layer 131. The first gate layer GTL1 may include the gate electrode TG of the thin film transistor TFT and a first capacitor electrode CAE1. The first gate layer GTL1 may be formed as a single layer or a multi-layer, which is made of at least one of molybdenum (Mo), aluminum (Al), chromium (Cr), gold (Au), titanium (Ti), nickel (Ni), neodymium (Nd), copper (Cu), and an alloy thereof.

The second gate insulating layer 132 may be disposed on the first gate layer GTL1. The second gate insulating layer 132 may be formed of an inorganic layer, for example, a silicon nitride layer, a silicon oxynitride layer, a silicon oxide layer, a titanium oxide layer, an aluminum oxide layer, the like, or a combination thereof.

The second gate layer GTL2 may be disposed on the second gate insulating layer 132. The second gate layer GTL2 may include a second capacitor electrode CAE2. The second gate layer GTL2 may be formed as a single layer or a multi-layer, which is made of at least one of molybdenum (Mo), aluminum (Al), chromium (Cr), gold (Au), titanium (Ti), nickel (Ni), neodymium (Nd), copper (Cu), and an alloy thereof.

The interlayer insulating layer 140 may be disposed on the second gate layer GTL2. The interlayer insulating layer 140 may be formed of an inorganic layer, for example, a silicon nitride layer, a silicon oxynitride layer, a silicon oxide layer, a titanium oxide layer, an aluminum oxide layer, the like, or a combination thereof.

The first data metal layer DTL1 may be disposed on the interlayer insulating layer 140. The first data metal layer DTL1 may include a first connection electrode CE1. The first data metal layer DTL1 may be formed as a single layer or a multi-layer, which is made of at least one of molybdenum (Mo), aluminum (Al), chromium (Cr), gold (Au), titanium (Ti), nickel (Ni), neodymium (Nd), copper (Cu), and an alloy thereof.

The first connection electrode CE1 may be connected (e.g., electrically connected) to the first electrode TS or the second electrode TD of the thin film transistor TFT through a first contact hole CT1 penetrating the interlayer insulating layer 140, the second gate insulating layer 132, and the first gate insulating layer 131.

The first planarization layer 160 for planarizing a step difference due to the active layer ACT, the first gate layer GTL1, the second gate layer GTL2, and the first data metal layer DTL1 may be formed on the first data metal layer DTL1. The first planarization layer 160 may be formed of an organic layer including an acrylic resin, an epoxy resin, a phenolic resin, a polyamide resin, a polyimide resin, the like, or a combination thereof.

The first insulating layer 161 may be disposed on the first planarization layer 160. The first insulating layer 161 may be formed of an inorganic layer, for example, a silicon nitride layer, a silicon oxynitride layer, a silicon oxide layer, a titanium oxide layer, an aluminum oxide layer, the like, or a combination thereof.

The second data metal layer DTL2 may be formed on the first insulating layer 161. The second data metal layer DTL2 may include a second connection electrode CE2 and a first power line VSL. The second connection electrode CE2 may be connected to the first connection electrode CE1 through a second contact hole CT2 penetrating the first insulating layer 161 and the first planarization layer 160. The second data metal layer DTL2 may be formed as a single layer or a multi-layer, which is made of at least one of molybdenum (Mo), aluminum (Al), chromium (Cr), gold (Au), titanium (Ti), nickel (Ni), neodymium (Nd), and copper (Cu), the like, or an alloy thereof.

The second planarization layer 170 for planarizing a step difference may be formed on the second data metal layer DTL2. The second planarization layer 170 may be formed of an organic layer including an acrylic resin, an epoxy resin, a phenolic resin, a polyamide resin, a polyimide resin, the like, or a combination thereof.

The second insulating layer 171 may be disposed on the second planarization layer 170. The second insulating layer 171 may be formed of an inorganic layer, for example, a silicon nitride layer, a silicon oxynitride layer, a silicon oxide layer, a titanium oxide layer, an aluminum oxide layer, the like, or a combination thereof.

A light emitting element layer EML may be disposed on the thin film transistor layer TFTL. For example, a light emitting element layer EML may be disposed on the second insulating layer 171. The light emitting element layer EML may include a pixel electrode PXE, a common electrode CE, and a light emitting element LE. Also, the light emitting element layer EML may include a bank 190, a bank insulating layer 191, and the like. A third data metal layer DTL3 may include the pixel electrode PXE and a common electrode CE. Each of the first sub-pixel SPX1, the second sub-pixel SPX2, and the third sub-pixel SPX3, which are described above, may include a light emitting element LE connected to a pixel electrode PXE and a common electrode CE. The pixel electrode PXE may be one of an anode electrode and a cathode electrode of the light emitting element LE. For example, the pixel electrode PXE may be an anode electrode. The common electrode CE may be another one of the anode electrode and the cathode electrode of the light emitting element LE. For example, the common electrode CE may be a cathode electrode.

The pixel electrode PXE and the common electrode CE may be disposed on the second insulating layer 171. The pixel electrode PXE may be connected (e.g., electrically connected) to the second connection electrode CE2 through a third contact hole CT3 penetrating the second insulating layer 171 and the second planarization layer 170. Therefore, the pixel electrode PXE may be electrically connected to the first electrode TS or the second electrode TD of the thin film transistor TFT through the first connection electrode CE1 and the second connection electrode CE2. Accordingly, a pixel voltage or an anode voltage, which is controlled by the thin film transistor TFT may be applied to the pixel electrode PXE.

The common electrode CE may be connected to the first power line VSL through a fourth contact hole CT4 penetrating the second insulating layer 171 and the second planarization layer 170. Therefore, a first power voltage of the first power line VSL may be applied to the common electrode CE.

The pixel electrode PXE and the common electrode CE may include a metal having a high reflectivity, such as a stacked structure (Ti/Al/Ti) of aluminum (Al) and titanium (Ti), a stacked structure (ITO/Al/ITO) of Al and Indium Tin Oxide (ITO), an APC alloy, a stacked structure (ITO/APC/ITO) of an APC alloy and ITO, or the like. The APC alloy may be an alloy of silver (Ag), palladium (Pd), and copper (Cu).

The light emitting element LE may include a first contact electrode CTE1 and a second contact electrode CTE2. FIG. 4 illustrates that the light emitting element LE is a flip chip type micro LED in which the first contact electrode CTE1 and the second contact electrode CET2 disposed while facing the pixel electrode PXE and the common electrode CE in the third direction DR3. The light emitting element LE may include an inorganic material such as gallium nitride (GaN) or the like. Each of a length of the light emitting element LE in the first direction DR1, a length of the light emitting element LE in the second direction DR2, and a length of the light emitting element LE in the third direction DR3 may be in a range of a few μm (micrometers) to a few hundreds μm (micrometers). For example, each of the length of the light emitting element LE in the first direction DR1, the length of the light emitting element LE in the second direction DR2, and the length of the light emitting element LE in the third direction DR3 may be less than or equal to about 100 μm.

The light emitting element LE may be grown and formed on a semiconductor substrate such as a silicon wafer or the like. The light emitting element LE may be transferred directly on the pixel electrode PXE and the common electrode CE of the substrate SUB from the silicon wafer. In another embodiment, the light emitting element LE may be moved (or transferred) on the pixel electrode PXE and the common electrode CE of the substrate SUB by an electrostatic method using an electrostatic head or a stamp method using, as a carrier substrate, a polymer material having elasticity such as polydimethylsiloxane (PDMS), silicon, or the like.

Referring to FIG. 4, each of light emitting elements LE may be a light emitting structure including a base substrate SPUB, an n-type semiconductor NSEM, an active layer MQW, a p-type semiconductor PSEM, the first contact electrode CTE1, and the second contact electrode CTE2.

The base substrate SPUB may be, for example, a sapphire substrate, but the disclosure is not limited thereto.

The n-type semiconductor NSEM may be disposed on a surface of the base substrate SPUB. For example, the n-type semiconductor NSEM may be disposed on a bottom surface (e.g., a surface located in an opposite direction of the third direction DR3) of the base substrate SPUB. The n-type semiconductor NSEM may be made of, for example, gallium nitride (GaN) doped with an n-type conductive dopant such as silicon (Si), germanium (Ge), selenium (Se), tellurium (Te), tin (Sn), or the like.

The active layer MQW may be disposed on a portion of a surface of the n-type semiconductor NSEM. The active layer MQW may include a material having a single-quantum well structure or a multi-quantum well structure. In case that the active layer MQW includes a material having a multi-quantum well structure, the active layer MQW may have a structure in which multiple well layers and multiple barrier layers are alternately stacked each other. The well layer may be formed of InGaN or the like, and the barrier layer may be formed of GaN, AlGaN, or the like. However, the disclosure is not limited thereto. In another embodiment, the active layer MQW may have a structure in which a semiconductor material having a large band gap energy and a semiconductor material having a small band gap energy are alternately stacked each other, or include Group III to V semiconductor materials depending on a wavelength band of emitted light.

The p-type semiconductor PSEM may be disposed on a surface (e.g., a surface located in the opposite direction of the third direction DR3) of the active layer MQW. The p-type semiconductor PSEM may be made of, for example, gallium nitride GaN doped with a p-type conductive dopant such as magnesium (Mg), zinc (Zn), calcium (Ca), barium (Ba), or the like.

The first contact electrode CTE1 may be disposed on the p-type semiconductor PSEM (e.g., the opposite direction of the third direction DR3), and the second contact electrode CTE2 may be disposed on another portion of the surface of the n-type semiconductor NSEM (e.g., the opposite direction of the third direction DR3). The another portion of the surface of the n-type semiconductor NSEM, on which the second contact electrode CTE2 is disposed, may be spaced apart from the portion of the surface of the n-type semiconductor NSEM, on which the active layer MQW is disposed.

The first contact electrode CTE1 and the pixel electrode PXE may be bonded to each other by a conductive adhesive member (not shown) such as an Anisotropic Conductive Film (ACF), an Anisotropic Conductive Paste (ACP), or the like. In another embodiment, the first contact electrode CTE1 and the pixel electrode PXE may be bonded to each other by a soldering process or the like.

The bank 190 covering an edge of the pixel electrode PXE and an edge of the common electrode CE may be disposed (e.g., partially disposed) on the second insulating layer 171. The bank 190 may be formed of an organic layer including an acrylic resin, an epoxy resin, a phenolic resin, a polyamide resin, a polyimide resin, the like, or a combination thereof.

The bank insulating layer 191 may be disposed on the bank 190. The bank insulating layer 191 may cover an edge of the pixel electrode PXE and an edge of the common electrode CE. The bank insulating layer 191 may be formed of an inorganic layer, for example, a silicon nitride layer, a silicon oxynitride layer, a silicon oxide layer, a titanium oxide layer, an aluminum oxide layer, the like, or a combination thereof.

Figure 5:
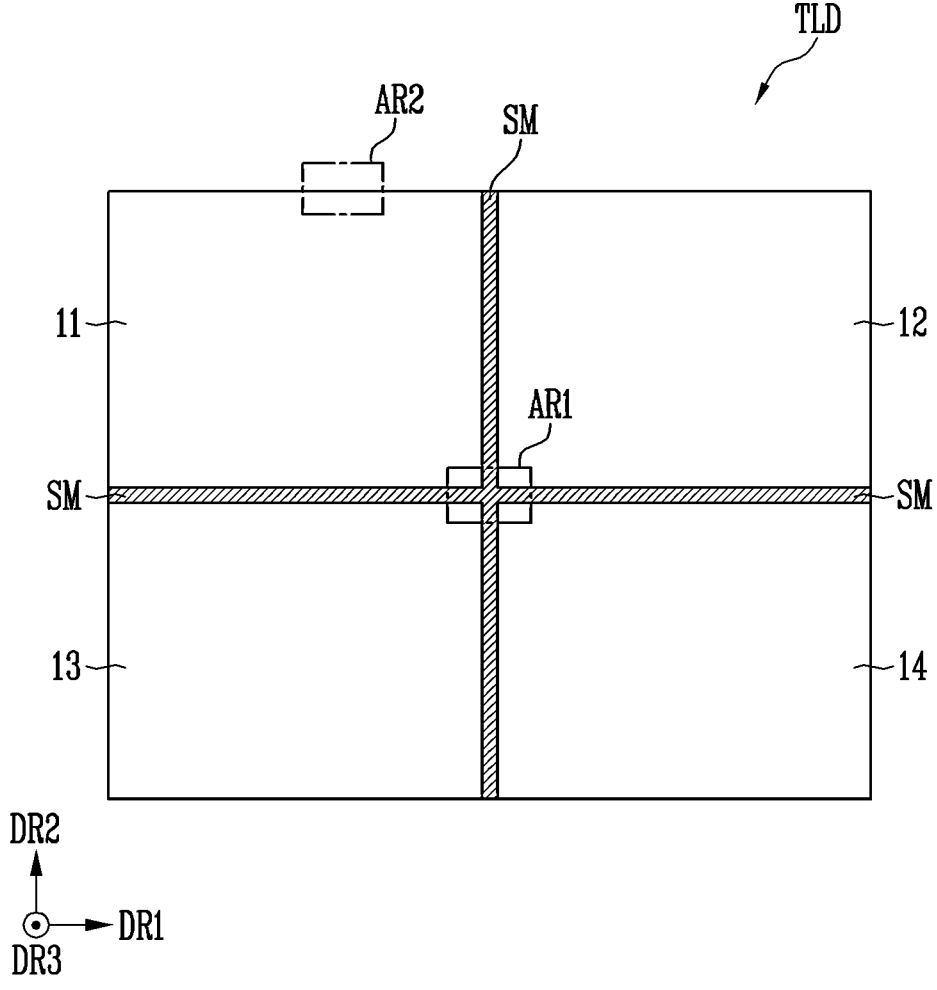
FIG. 5 is a schematic plan view illustrating a tiled display device including multiple display devices in accordance with embodiments of the disclosure.

FIG. 5 is a schematic plan view illustrating a tiled display device TLD including multiple display devices 11, 12, 13, and 14 in accordance with embodiments of the disclosure.

Referring to FIG. 5, the tiled display device TLD may include multiple display devices 11, 12, 13, and 14, and a joining part SM. For example, the tiled display device TLD may include a first display device 11, a second display device 12, a third display device 13, and a fourth display device 14.

The display devices 11, 12, 13, and 14 may be arranged in a lattice form. The display devices 11, 12, 13, and 14 may be arranged in a matrix form of M (M is a positive integer) rows and N (N is a positive integer) columns. For example, the first display device 11 and the second display device 12 may be disposed adjacent to each other in the first direction DR1. The first display device 11 and the third display device 13 may be disposed adjacent to each other in the second direction DR2. The third display device 13 and the fourth display device 14 may be disposed adjacent to each other in the first direction DR1. The second display device 12 and the fourth display device 14 may be disposed adjacent to each other in the second direction DR2.

However, the number and an arrangement of the display devices 11, 12, 13, and 14 included in the tiled display device TLD are not limited thereto shown in FIG. 5. The number and the arrangement of the display devices 11, 12, 13, and 14 included in the tiled display device TLD may be differently set depending on a size of each of the display devices 11, 12, 13, and 14 and the tiled display device TLD, a shape of the tiled display device TLD, the like, or a combination thereof.

FIG. 5 illustrates that the display devices 11, 12, 13, and 14 have a same size. However, the disclosure is not limited thereto. For example, in an embodiment, at least one of the display devices 11, 12, 13, and 14 may have a size different from a size of other display devices.

Each of the display devices 11, 12, 13, and 14 may have a rectangular shape including long sides and short sides in a plan view. The display devices 11, 12, 13, and 14 may be arranged such that long sides or short sides are connected to each other. Some or all of the display devices 11, 12, 13, and 14 may be disposed at an edge of the tiled display device TLD, and form a side of the tiled display device TLD. At least one of the display devices 11, 12, 13, and 14 may be disposed at a corner of the tiled display device TLD, and form two adjacent sides of the tiled display device TLD. At least one of the display devices 11, 12, 13, and 14 may be surrounded by another one of the display devices 11, 12, 13, and 14.

Each of the display devices 11, 12, 13, and 14 may be substantially identical to the display device 10 (see, e.g., FIG. 1) described in conjunction with FIGS. 1 to 4. Therefore, descriptions of each of the display devices 11, 12, 13, and 14 will be omitted.

The joining part SM may include a coupling member, an adhesive member, the like, or a combination thereof. The display devices 11, 12, 13, and 14 may be connected to each other by the coupling member or the adhesive member of the joining part SM. The joining part SM may be disposed between the first display device 11 and the second display device 12, between the first display device 11 and the third display device 13, between the second display device 12 and the fourth display device 14, and between the third display device 13 and the fourth display device 14.

Figure 6:
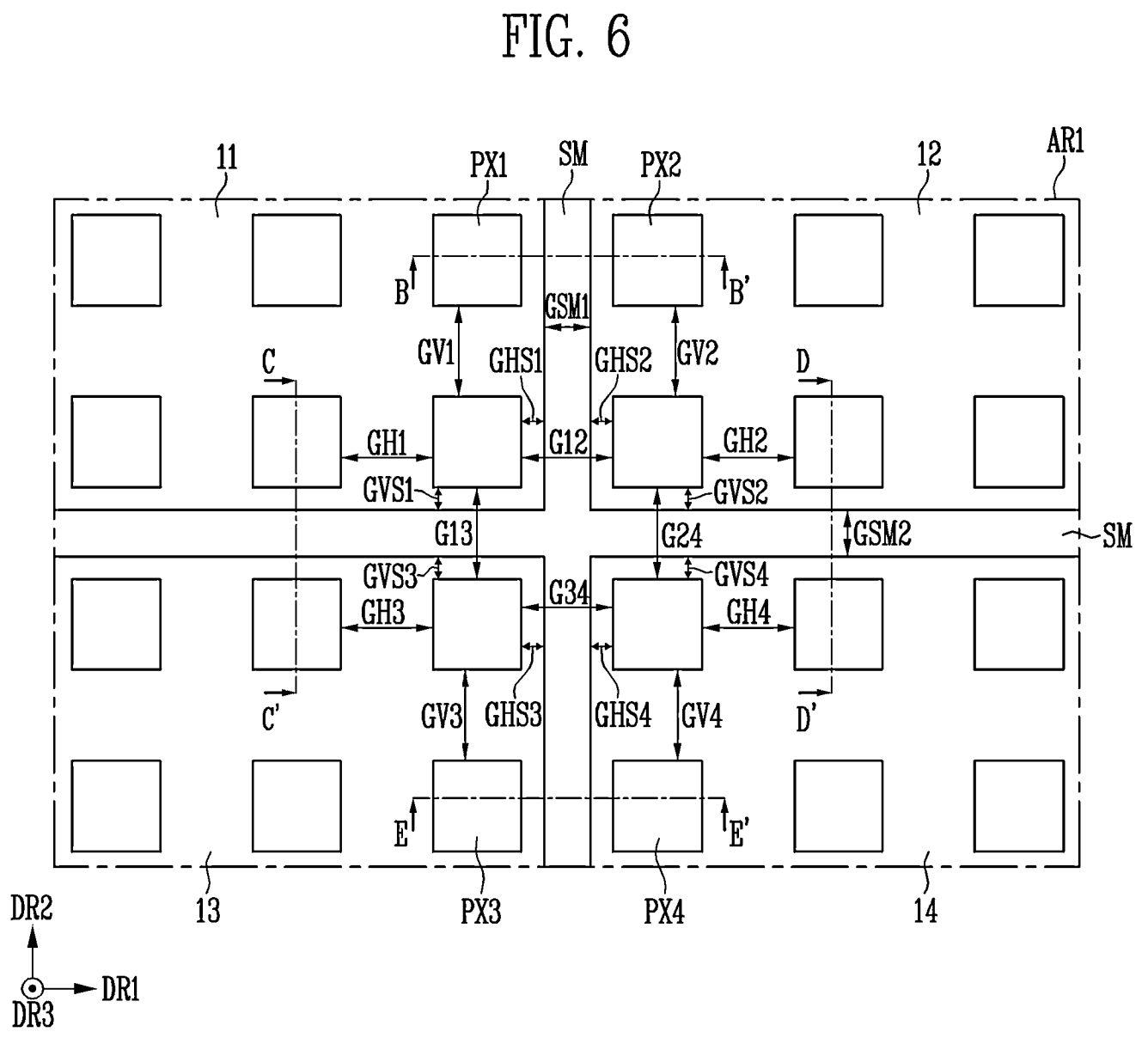

FIG. 6 is a schematic enlarged plan view illustrating area AR1 of FIG. 5.

Referring to FIG. 6, the joining part SM may have a shape of a crosshair, a cross, or plus sign in a central area of the tiled display device TLD in a plan view, in which the first display device 11, the second display device 12, the third display device 13, and the fourth display device 14 are disposed adjacent to each other.

The first display device 11 may include first pixels PX1 arranged in a matrix form in the first direction DR1 and the second direction DR2 and display an image. The second display device 12 may include second pixels PX2 arranged in a matrix form in the first direction DR1 and the second direction DR2 and display an image. The third display device 13 may include third pixels PX3 arranged in a matrix form in the first direction DR1 and the second direction DR2 and display an image. The fourth display device 14 may include fourth pixels PX4 arranged in a matrix form in the first direction DR1 and the second direction DR2 and display an image.

A minimum distance between first pixels PX1 disposed adjacent to each other in the first direction DR1 may be a first horizontal separation distance GH1, and a minimum distance between second pixels PX2 disposed adjacent to each other in the first direction DR1 may be a second horizontal separation distance GH2. The first horizontal separation distance GH1 and the second horizontal separation distance GH2 may be substantially the same.

A joining part SM may be disposed between a first pixel PX1 and a second pixel PX2, which are disposed adjacent to each other in the first direction DR1. A minimum distance G12 between the first pixel PX1 and the second pixel PX2, which are disposed adjacent to each other in the first direction DR1, may be a sum of a minimum distance GHS1 between the first pixel PX1 and the joining part SM in the first direction DR1, a minimum distance GHS2 between the second pixel PX2 and the joining part SM in the first direction DR1, and a width GSM1 of the joining part SM in the first direction DR1.

The minimum distance G12 between the first pixel PX1 and the second pixel PX2, which are disposed adjacent to each other in the first direction DR1, the first horizontal separation distance GH1, and the second horizontal separation distance GH2 may be substantially the same. To this end, the minimum distance GHS1 between the first pixel PX1 and the joining part SM in the first direction DR1 may be smaller than the first horizontal separation distance GH1, and the minimum distance GHS2 between the second pixel PX2 and the joining part SM in the first direction DR1 may be smaller than the second horizontal separation distance GH2. The width GSM1 of the joining part SM in first direction DR1 may be smaller than the first horizontal separation distance GH1 or the second horizontal separation distance GH2.

A minimum distance between third pixels PX3 disposed adjacent to each other in the first direction DR1 may be a third horizontal separation distance GH3, and a minimum distance between fourth pixels PX3 disposed adjacent to each other in the first direction DR1 may be a fourth horizontal separation distance GH4. The third horizontal separation distance GH3 and the fourth horizontal separation distance GH4 may be substantially the same.

The joining part SM may be disposed between a third pixel PX3 and a fourth pixel PX4, which are disposed adjacent to each other in the first direction DR1. A minimum distance G34 between the third pixel PX3 and the fourth pixel PX4, which are disposed adjacent to each other in the first direction DR1, may be a sum of a minimum distance GHS3 between the third pixel PX3 and the joining part SM in the first direction DR1, a minimum distance GHS4 between the fourth pixel PX4 and the joining part SM in the first direction DR1, and the width GSM1 of the joining part SM in the first direction DR1.

The minimum distance G34 between the third pixel PX3 and the fourth pixel PX4, which are disposed adjacent to each other in the first direction DR1, the third horizontal separation distance GH3, and the fourth horizontal separation distance GH4 may be substantially the same. To this end, the minimum distance GHS3 between the third pixel PX3 and the joining part SM in the first direction DR1 may be smaller than the third horizontal separation distance GH3, and the minimum distance GHS4 between the fourth pixel PX4 and the joining part SM in the first direction DR1 may be smaller than the fourth horizontal separation distance GH4. The width GSM1 of the joining part SM in first direction DR1 may be smaller than the third horizontal separation distance GH3 or the fourth horizontal separation distance GH4.

A minimum distance between first pixels PX1 disposed adjacent to each other in the second direction DR2 may be a first vertical separation distance GV1, and a minimum distance between third pixels PX3 disposed adjacent to each other in the second direction DR2 may be a third vertical separation distance GV3. The first vertical separation distance GV1 and the third vertical separation distance GV3 may be substantially the same.

The joining part SM may be disposed between a first pixel PX1 and a third pixel PX3, which are disposed adjacent to each other in the second direction DR2. A minimum distance G13 between the first pixel PX1 and the third pixel PX3, which are disposed adjacent to each other in the second direction DR2, may be a sum of a minimum distance GVS1 between the first pixel PX1 and the joining part SM in the second direction DR2, a minimum distance GVS3 between the third pixel PX3 and the joining part SM in the second direction DR2, and a width GSM2 of the joining part SM in the second direction DR2.

The minimum distance G13 between the first pixel PX1 and the third pixel PX3, which are disposed adjacent to each other in the second direction DR2, the first vertical separation distance GV1, and the third vertical separation distance GV3 may be substantially the same. To this end, the minimum distance GVS1 between the first pixel PX1 and the joining part SM in the second direction DR2 may be smaller than the first vertical separation distance GV1, and the minimum distance GVS3 between the third pixel PX3 and the joining part SM in the second direction DR2 may be smaller than the third vertical separation distance GV3. The width GSM2 of the joining part SM in the second direction DR2 may be smaller than the first vertical separation distance GV1 or the third vertical separation distance GV3.

A minimum distance between second pixels PX2 disposed adjacent to each other in the second direction DR2 may be a second vertical separation distance GV2, and a minimum distance between fourth pixels PX4 disposed adjacent to each other in the second direction DR2 may be a fourth vertical separation distance GV4. The second vertical separation distance GV2 and the fourth vertical separation distance GV4 may be substantially the same.

The joining part SM may be disposed between a second pixel PX2 and a fourth pixel PX4, which are disposed adjacent to each other in the second direction DR2. A minimum distance G24 between the second pixel PX2 and the fourth pixel PX4, which are disposed adjacent to each other in the second direction DR2, may be a sum of a minimum distance GVS2 between the second pixel PX2 and the joining part SM in the second direction DR2, a minimum distance GVS4 between the fourth pixel PX4 and the joining part SM in the second direction DR2, and the width GSM2 of the joining part SM in the second direction DR2.

The minimum distance G24 between the second pixel PX2 and the fourth pixel PX4, which are disposed adjacent to each other in the second direction DR2, the second vertical separation distance GV2, and the fourth vertical separation distance GV4 may be substantially the same. To this end, the minimum distance GVS2 between the second pixel PX2 and the joining part SM in the second direction DR2 may be smaller than the second vertical separation distance GV2, and the minimum distance GVS4 between the fourth pixel PX4 and the joining part SM in the second direction DR2 may be smaller than the fourth vertical separation distance GV4. The width GSM2 of the joining part SM in the second direction DR2 may be smaller than the second vertical separation distance GV2 or the fourth vertical separation distance GV4.

As shown in FIG. 6, to prevent the joining part SM from being viewed between images displayed by the display devices 11, 12, 13, and 14, a minimum distance between pixels of adjacent ones of the display devices 11, 12, 13, and 14 and a minimum distance between pixels of each of the display devices 11, 12, 13, and 14 may be substantially the same.

Figure 7:
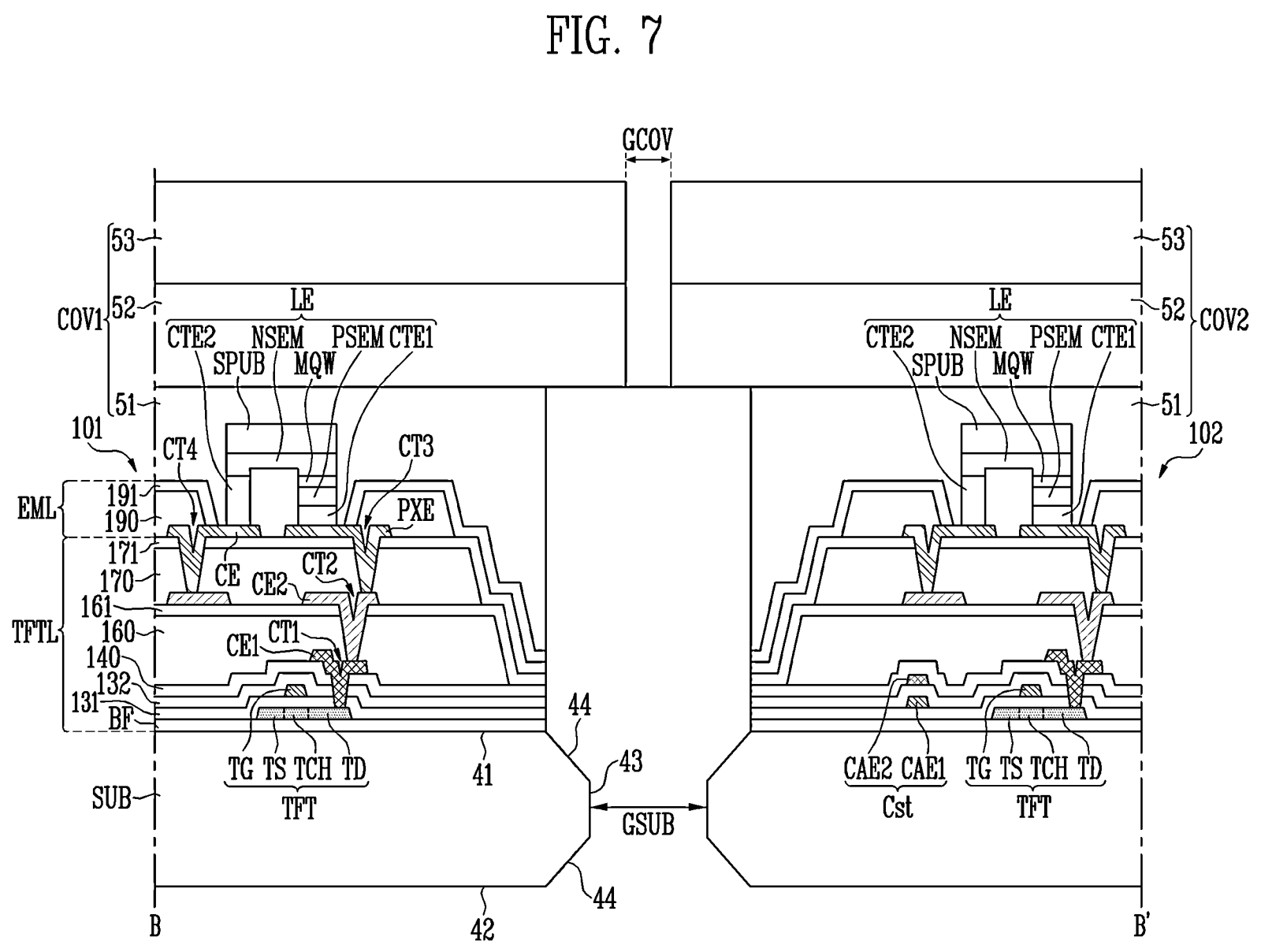

FIG. 7 is a schematic cross-sectional view illustrating the tiled display device TLD taken along line B-B' of FIG. 6 in accordance with an embodiment of the disclosure.

Referring to FIG. 7, the first display device 11 (see, e.g., FIG. 6) may include a first display panel 101 and a first front cover (or a first top cover) COV1. The second display device 12 (see, e.g., FIG. 6) may include a second display panel 102 and a second front cover (or a second top cover) COV2.

Each of the first display panel 101 and the second display panel 102 may include a substrate SUB, a thin film transistor layer TFTL, and a light emitting element layer EML. The thin film transistor layer TFTL and the light emitting element layer EML have already been described in detail in conjunction with FIG. 4. In FIG. 7, descriptions overlapping with those in FIG. 4 will be omitted.

The substrate SUB may include a first surface 41 on which the thin film transistor layer TFTL is disposed, a second surface 42 facing the first surface 41 in the third direction DR3, and a first side surface 43 disposed between the first surface 41 and the second surface 42. The first surface 41 may be a front surface (or a top surface) of the substrate SUB, and the second surface 42 may be a rear surface (or a bottom surface) of the substrate SUB.

Also, the substrate SUB may further include a chamfered surface 44 disposed between the first surface 41 and the first side surface 43 and between the second surface 42 and the first side surface 43. The thin film transistor layer TFTL and the light emitting element layer EML may not be disposed on the chamfered surface 44. Due to the chamfered surface 44, the substrate SUB of the first display device 11 and a substrate SUB of the second display device 12 may be prevented from colliding with each other and being damaged.

The chamfered surface 44 may be disposed between other side surfaces (e.g., a second side surface, a third side surface, and a fourth side surface) other than the first surface 41 and the first side surface 43 and between other side surfaces other than the second surface 42 and the first side surface 43. For example, in case that the first display device 11 and the second display device 12 have a rectangular shape in a plan view as shown in FIG. 5, the substrate SUB may be disposed between the first surface 41 and each of a second side surface, a third side surface, and a fourth side surface and between the second surface 42 and each of the second side surface, the third side surface, and the fourth side surface.

The first front cover COV1 may be disposed on the chamfered surface 44 of the substrate SUB. For example, the first front cover COV1 may protrude over the substrate SUB in the first direction DR1 and the second direction DR2. Therefore, a distance GSUB between the substrate SUB of the display device 11 and the substrate SUB of the second display device 12 in the first direction DR1 and the second direction DR2 may be greater than a distance GCOV between the first front cover COV1 and the second front cover COV2 in the first direction DR1 and the second direction DR2.

Each of the first front cover COV1 and the second front cover COV2 may include an adhesive member 51, a light transmittance adjusting layer 52 disposed on the adhesive layer 51, and an anti-glare layer 53 disposed on the light transmittance adjusting layer 52.

The description below will focus on the components of the first front cover COV1, but descriptions of corresponding components may be applied to the adhesive member 51, the light transmittance adjusting layer 52, and the anti-glare layer 53 of the second front cover COV2 as well.

The adhesive member 51 may attach the first front cover COV1 to the light emitting element layer EML of the first display panel 101. The adhesive member 51 may be a transparent adhesive member that transmits light through adhesive member. For example, the adhesive member 51 may be an optically clear adhesive film, an optically clear resin, or the like.

The light transmittance adjusting layer 52 may lower the transmittance of external light incident from an outside or lower the transmittance of reflected light obtained as external light transmitted through light transmittance adjusting layer 52 is reflected from the first display panel 101 and the second display panel 102 and re-incident. As the first front cover COV1 includes the light transmittance adjusting layer 52, the first front cover COV1 may prevent the joining part SM (see, e.g., FIG. 6) from being viewed from an outside. Accordingly, a seamless tiled display device TLD (see, e.g., FIG. 5) may be implemented.

The anti-glare layer 53 may prevent reflected light by a metal line or the like in the display device 10 (see, e.g., FIG. 1) from being viewed from an outside. For example, the display device 10 may include a metal line of the thin film transistor layer TFTL or a metal electrode (e.g., the pixel electrode PXE) on the thin film transistor layer TFTL. As external light incident from the outside may be reflected by the metal line or the like, the reflected light may be viewed from the outside. Excessive reflected light may reduce the visibility of an image, and the anti-glare layer 53 may be designed to diffusely reflect external light and/or reflected light and prevent the deterioration of the visibility of the image. As the first front cover COV1 includes the anti-glare layer 53, a contrast ratio of an image which the display device 10 (see, e.g., FIG. 1) displays may be improved.

The light transmittance adjusting layer 52 may be, for example, a phase retardation layer. The anti-glare layer 53 may be, for example, a polarizing plate. However, the disclosure is not limited thereto.

An embodiment of the tiled display device TLD (see, e.g., FIG. 5) taken along lines C-C', D-D', and E-E' of FIG. 6 may be similar or substantially identical to an embodiment of the tiled display device taken along the line B-B', which is described in conjunction with FIG. 7.

Figure 8:
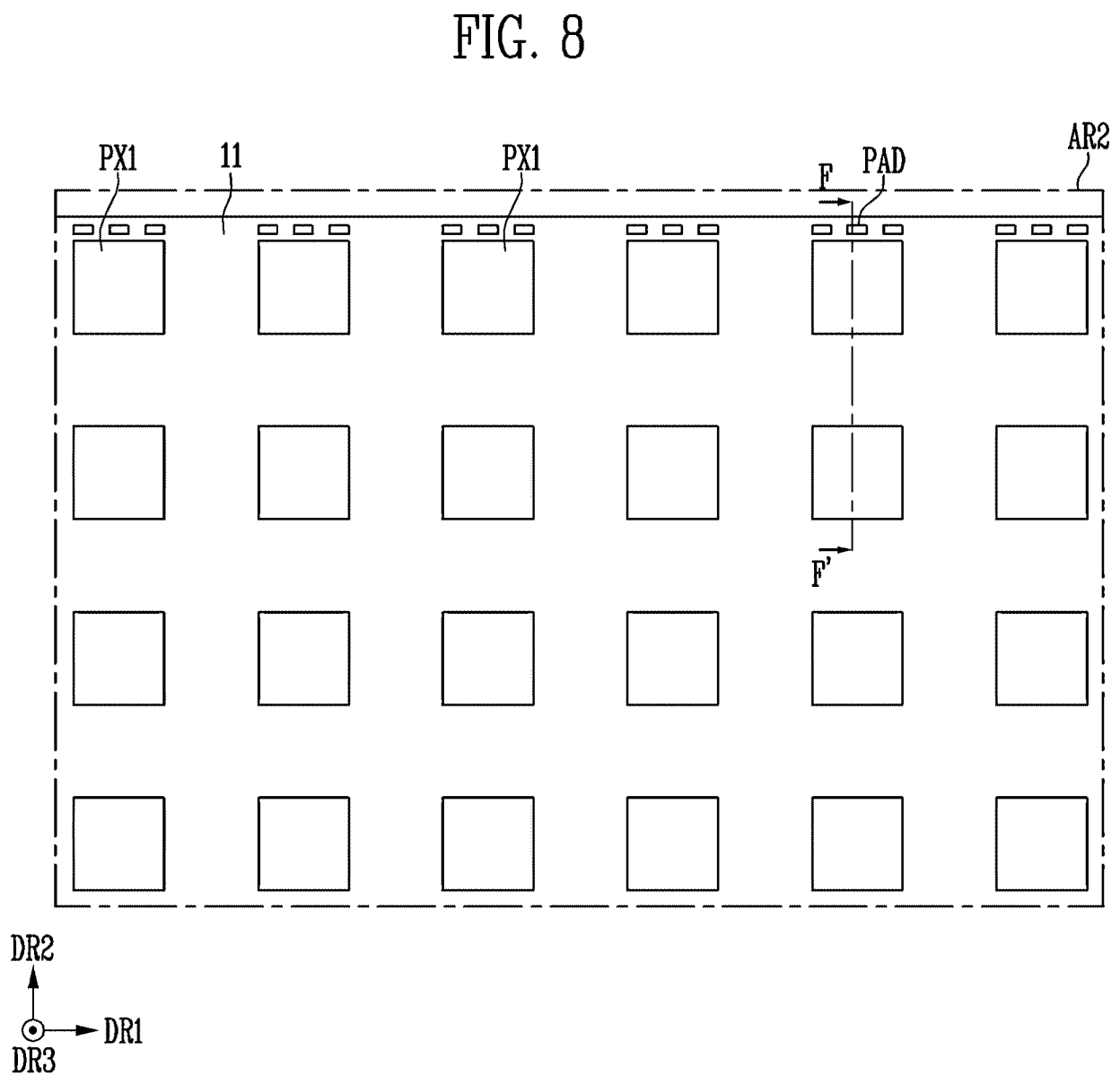

FIG. 8 is a schematic enlarged plan view illustrating area AR2 of FIG. 5.

In FIG. 8, pads PAD disposed at an upper side of the first display device 11 and first pixels PX1 are illustrated.

Referring to FIG. 8, at least one pad PAD may be disposed at (or adjacent to) an upper edge of the first display device 11. In case that data lines (not shown) of the first display device 11 extend in the second direction DR2, the pad PAD may be disposed at (or adjacent to) the upper edge and/or a lower edge of the first display device 11. In another embodiment, in case that the data lines of the first display device 11 extend in the first direction DR1, the pad PAD may be disposed at (or adjacent to) a left edge and/or a right edge of the first display device 11.

The pad PAD may be electrically connected to a data line. Also, the pad PAD may be electrically connected to a side line (not shown).

The side line may be disposed on a side surface of the substrate SUB (see, e.g., FIG. 7). The side line may extend from the side surface of the substrate SUB to the bottom surface (or the rear surface) of the substrate SUB. The side line may be connected to a connection line (not shown) on the bottom surface of the substrate SUB. The side line and the connection line will be described in more detail with reference to FIG. 9.

Figure 9:
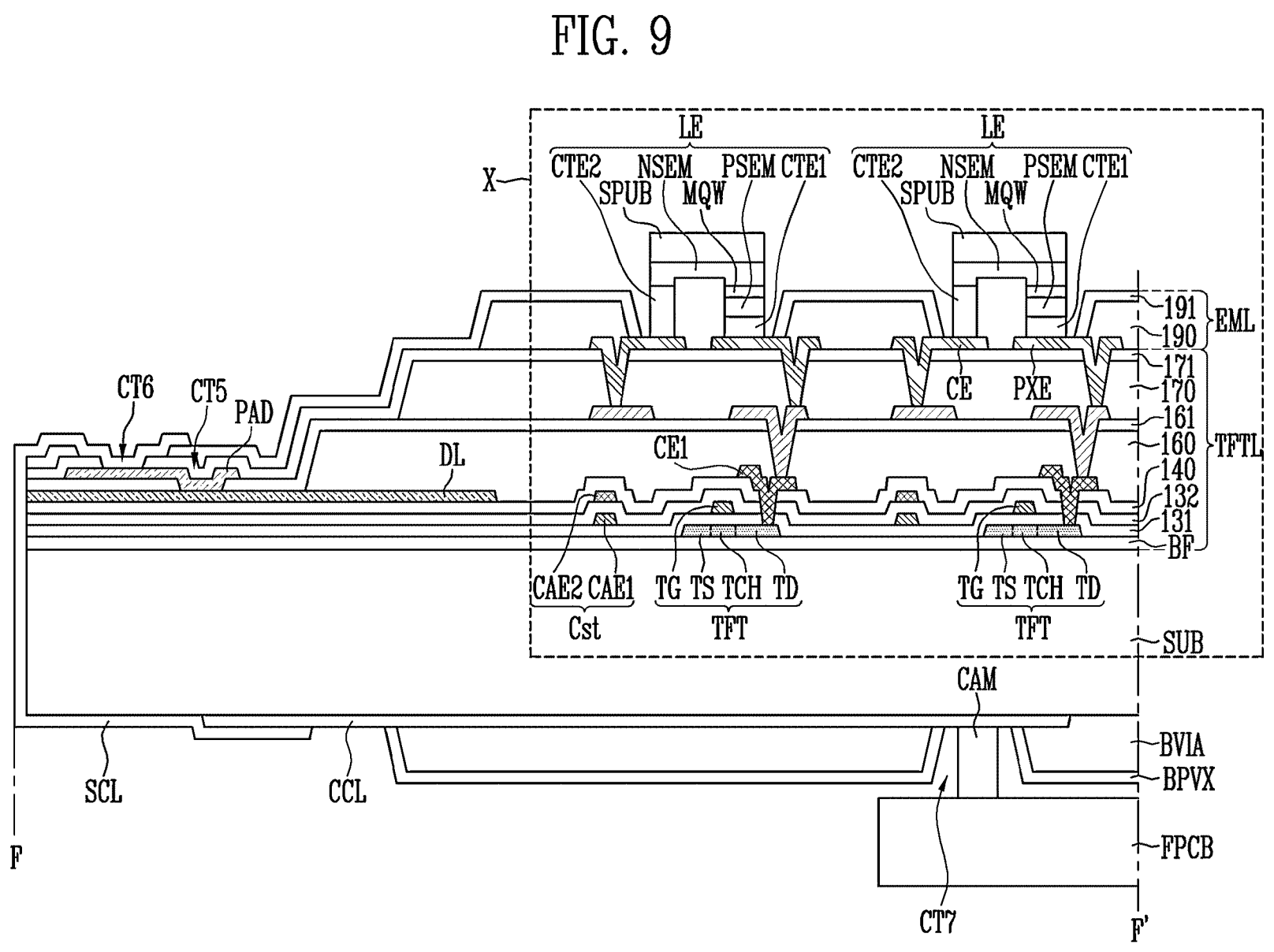

FIG. 9 is a schematic cross-sectional view illustrating the tiled display device TLD taken along line F-F' of FIG. 8 in accordance with embodiments of the disclosure.

In FIG. 9, components identical to those shown in the cross-sectional view illustrated in FIG. 4 are designated by like reference numerals. Descriptions of portions overlapping with those shown in FIG. 4 will be omitted.

Referring to FIG. 9, a pad PAD may be disposed on the first insulating layer 161. The pad PAD may not be covered by the bank insulating layer 191, but may be exposed. The pad PAD and the pixel electrodes PXE and the common electrodes CE may include a same material. For example, the pad PAD may include a stacked structure (Ti/Al/Ti) of Al and Ti, a stacked structure (ITO/Al/ITO) of Al and ITO, an APC alloy, a stacked structure (ITO/APC/ITO) of the APC alloy and ITO, or the like. The pad PAD may include a metal having a high reflectivity.

The first data metal layer DTL1 may include a data line DL. The data line DL may be disposed on the interlayer insulating layer 140. For example, the data line DL and the first connection electrode CE1 may be disposed in a same layer, and include a same material.

The pad PAD may be electrically connected to the data line DL through a fifth contact hole CT5 penetrating the first insulating layer 161. In an embodiment, a link line (not shown) may be further located between the pad PAD and the data line DL. The pad PAD and the data line DL may not be directly connected to each other, but may be electrically connected to each other through the link line.

A connection line CCL may be disposed on the bottom surface (or the rear surface) of the substrate SUB. The connection line CCL may be formed as a single layer or a multi-layer, which is made of at least one of molybdenum (Mo), aluminum (Al), chromium (Cr), gold (Au), titanium (Ti), nickel (Ni), neodymium (Nd), copper (Cu), and an alloy thereof.

A bottom planarization layer (or a rear planarization layer) BVIA may be disposed on and cover a portion of the connection line CCL. The bottom planarization layer BVIA may be formed of an organic layer including an acrylic resin, an epoxy resin, a phenolic resin, a polyamide resin, a polyimide resin, the like, or a combination thereof.

A bottom insulating layer (or a rear insulating layer) BPVX may be disposed on a bottom surface (or a rear surface) of the bottom planarization layer BVIA (e.g., while covering the bottom planarization layer BVIA). The bottom insulating layer BPVX may include an inorganic layer. For example, the inorganic layer may be formed as a silicon nitride layer, a silicon oxynitride layer, a silicon oxide layer, a titanium oxide layer, an aluminum oxide layer, the like, or a combination thereof.

A side line SCL may be disposed on a bottom surface of the substrate SUB and extend to a side surface and a top surface (or a front surface) from a bottom surface of the substrate SUB.

An end of the side line SCL may be electrically connected to the connection line CCL. For example, the end of the side line SCL may be connected to a side surface and a bottom surface of the connection line CCL. Another end of the side line SCL may be electrically connected to the pad PAD. For example, the another end of the side line SCL may be connected to the pad PAD through a sixth contact hole CT6 penetrating the bank insulating layer 191 and the second insulating layer 171.

The side line SCL may be disposed on a side surface of the substrate SUB, a side surface of the buffer layer BF, a side surface of the first gate insulating layer 131, a side surface of the second gate insulating layer 132, a side surface of the interlayer insulating layer 140, a side surface of the first insulating layer 161, a side surface of the second insulating layer 171 and a side surface of the bank insulating layer 191.

A flexible film FPCB may be disposed under the bottom insulating layer BPVX (i.e., toward the bottom surface of the substrate SUB). The flexible film FPCB may be electrically connected to the connection line CCL through a conductive adhesive member CAM.

The flexible film FPCB may be connected to the connection line CCL through a seventh contact hole CT7.

The seventh contact hole CT7 may be a hole penetrating the bottom planarization layer BVIA and the bottom insulating layer BPVX, and be a hole formed in an area in which the bottom planarization layer BVIA and the bottom insulating layer BPVX are removed.

A data driving circuit (not shown) for supplying data voltages to data lines DL may be mounted on a surface of the flexible film FPCB. The data driving circuit may be, for example, a Source Driver Integrated Circuit (SDIC).

The conductive adhesive member CAM electrically connecting the flexible film FPCB and the connection line CCL may be, for example, an Anisotropic Conductive Film (ACF) or an Anisotropic Conductive Paste (ACP), but the disclosure is not limited thereto.

Referring to FIG. 9, the flexible film FPCB may be disposed on the bottom surface (or the rear surface) of the substrate SUB, and may be connected to the pad PAD through the connection line CCL, the side line SCL, and the like. Accordingly, the pixel PX may be disposed even in an edge area of the display panel 100 (see, e.g., FIG. 1), and a ratio of a display area in which an image is displayed may be increased.

Figure 10:
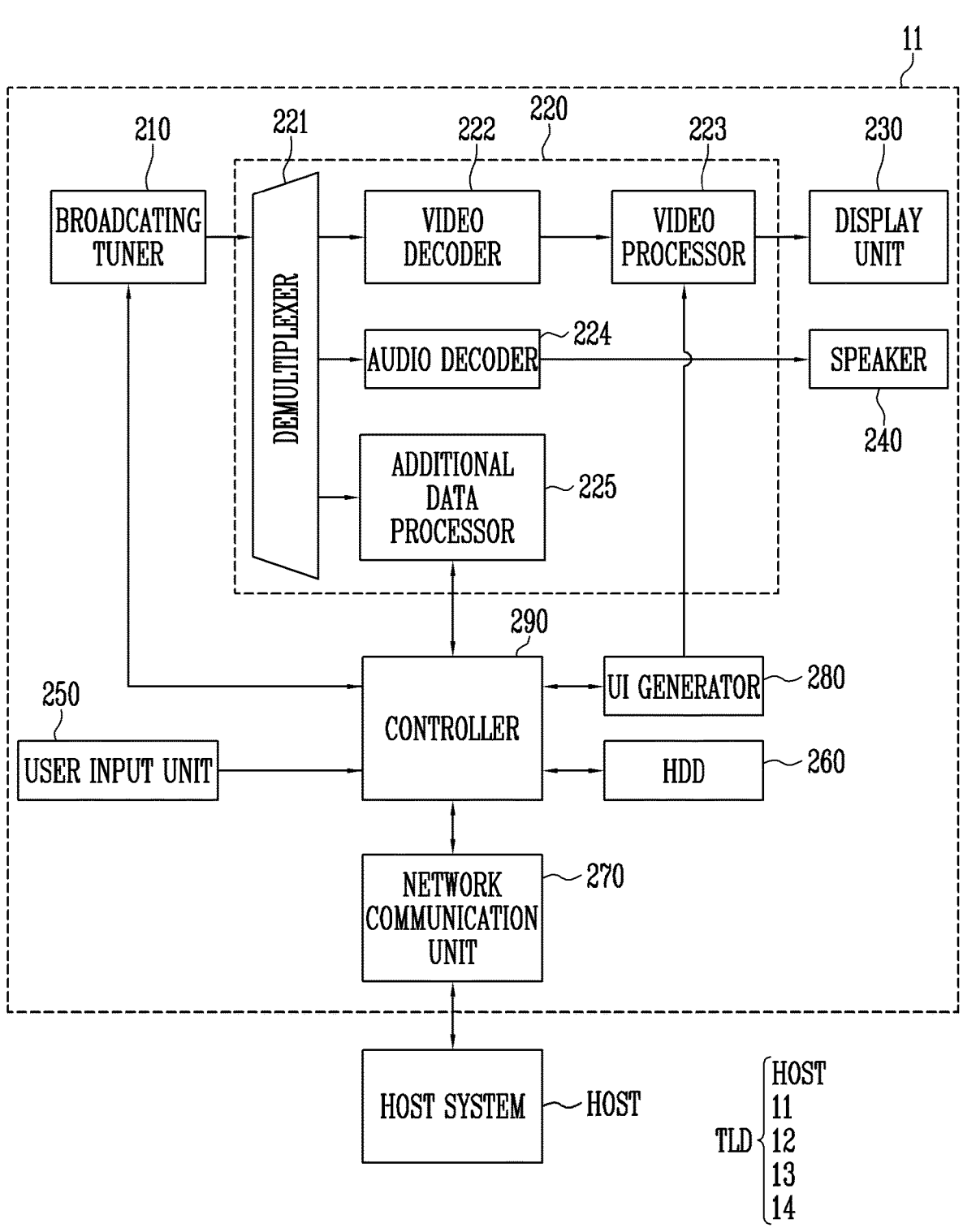
FIG. 10 is a schematic block diagram illustrating a tiled display device in accordance with embodiments of the disclosure.

FIG. 10 is a schematic block diagram illustrating a tiled display device TLD in accordance with embodiments of the disclosure.

Referring to FIG. 10, the tiled display device TLD in accordance with the embodiment of the disclosure may include a host system HOST and multiple display devices 11, 12, 13, and 14.

In FIG. 10, for convenience of description, it is illustrated that the host system HOST controls the first display device 11. However, the disclosure is not limited thereto, and the host system HOST may control the display devices 11, 12, 13, and 14.

The host system HOST may be, for example, a set top box, an Application Processor (AP), the like, or a combination thereof.

A command of a user may be input in various forms to the host system HOST. For example, a command by a touch input of the user may be input to the host system HOST. In another embodiment, a command of the user from an external input device (e.g., a keyboard input, a button input of a remote controller, or the like) may be input to the host system HOST.

The host system HOST may receive original video data corresponding to an original image, which is input from an outside. The host system HOST may divide the original video data into video data of which number corresponding to the number of the display devices 11, 12, 13, and 14. For example, the host system HOST may divide original video data corresponding to a first display device 11, a second display device 12, a third display device 13, and a fourth display device 14 into first video data corresponding to a first image, second video data corresponding to a second image, third video data corresponding to a third image, and fourth video data corresponding to a fourth image. The host system HOST may transmit the first video data to the first display device 11, transmit the second video data to the second display device 12, transmit the third video data to the third display device 13, and transmit the fourth video data to the fourth display device 14.

The first display device 11 may display a first image according to the first video data, the second display device 12 may display a second image according to the second video data, the third display device 13 may display a third image according to the third video data, and the fourth display device 14 may display a fourth image according to the fourth video data. Accordingly, the user may view an original image obtained by combining the first to fourth images displayed in the first to fourth display devices 11, 12, 13, and 14.

Referring to FIG. 10, the first display device 11 may include a broadcasting tuner 210, a signal processor 220, a display part (or a display unit) 230, a speaker 240, a user input part (or a user input unit) 250, a hard disk drive (HDD) 260, a network communication part (or a network communication unit) 270, a user interface (UI) generator 280, and a controller 290.

The broadcasting tuner 210 may receive a broadcasting signal of a corresponding channel through an antenna by tuning a channel frequency (e.g., a predetermined or selectable channel frequency) under a control of the controller 290. The broadcasting tuner 210 may include a channel direction module, a radio frequency (RF) demodulation module, the like, or a combination thereof.

A broadcasting signal demodulated by the broadcasting tuner 210 may be processed by the signal processor 220 and be output to the display part 230 and the speaker 240. The signal processor 220 may include a demultiplexer 221, a video decoder 222, a video processor 223, an audio decoder 224, and an additional data processor 225.

The demultiplexer 221 may separate the demodulated broadcasting signal into a video signal, an audio signal, and additional data. The video signal, the audio signal, and the additional data, which are separated, may be respectively recovered by the video decoder 222, the audio decoder 224, and the additional data processor 225. The video decoder 222, the audio decoder 224, and the additional data processor 225 may recover the video signal, the audio signal, and the additional data in a decoding format corresponding to an encoding format in case that a broadcasting signal is transmitted.

The decoded video signal may be converted by the video processor 223 and fit a vertical frequency, a resolution, an image rate, the like, or a combination thereof, which are suitable for output standards of the display part 230, and the decoded audio signal may be output to the speaker 240.

The display part 230 may include a display panel 100 (see, e.g., FIG. 1) for displaying an image and a panel driver for controlling driving of the display panel 100.

The user input part 250 may receive a signal transmitted from the host system HOST. The user input part 250 may input not only data about selection of a channel transmitted from the host system HOST and selection and manipulation of an UI menu, but also data about that the user selects and input a command for communication with another display device.

The HDD 260 may store various software programs including an operating system (OS) program, recorded broadcasting programs, moving images, pictures, other data, the like, or a combination thereof, and may be a storage medium such as a hard disk, a nonvolatile memory, the like, or a combination thereof. The HDD 260 may be a storage part (or storage unit).

The network communication part 270 may perform near field communication with the host system HOST and another display device, and may be a communication module including an antenna pattern implementing mobile communication, data communication, Bluetooth, RF, Ethernet, the like, or a combination thereof. The network communication part 270 may transmit and/or receive a wireless signal of at least one of a base station, an external terminal, and a sever on a mobile communication network built in according to a technical standard or communication scheme for mobile communication (e.g., global system for mobile communication (GSM), code division multi access (CDMA), code division multi access 2000 (CDMA2000), enhanced voice-data optimized or enhanced voice-data only (EV-DO), wideband CDMA (WCDMA), high speed downlink packet access (HSDPA), high speed uplink packet access (HSUPA), long term evolution (LTE), long term evolution-advanced (LTEA), 5G, or the like) through the antenna pattern which will be described.

The network communication part 270 may transmit or receive a wireless signal in a communication network according to wireless Internet technologies through the antenna pattern which will be described below. The wireless Internet technologies may include, for example, wireless local area network (wireless LAN, WLAN), wireless-fidelity (Wi-Fi), Wi-Fi direct, digital living network alliance (DLNA), wireless broadband (WiBro), world interoperability for microwave access (WiMAX), high speed downlink packet access (HSDPA), high speed uplink packet access (HSUPA), long term evolution (LTE), long term evolution-advanced (LTE-A), the like, or a combination thereof. The antenna pattern may transmit or receive data according to at least one wireless Internet technology in a range including Internet technologies which are not listed in the above.

The UI generator 280 may generate a UI menu for communication with the host system HOST and another display device, and may be implemented by an algorithm code, an on-screen display integrated circuit (OSD IC), the like, or a combination thereof. The UI menu for communication with the host system HOST and another display device may be a menu for specifying an opponent digital television (TV) (e.g., a desired opponent digital TV) and selecting a function (e.g., a desired function).

The controller 290 may take charge of overall control of the first display device 11 and take charge of communication control of the host system HOST and the second to fourth display devices 12, 13, and 14. The controller 290 may be implemented by a micro control unit (MCU) in which a corresponding algorithm code for control is stored and executed.

The controller 290 may control a corresponding control command and corresponding data to be transmitted to the host system HOST and the second to fourth display devices 12, 13, and 14 through the network communication part 270 according to an input and selection of the user input part 250. In case that a control command (e.g., a predetermined or selectable control command) and a data (e.g., a predetermined or selectable data) are input from the host system HOST and the second to fourth display devices 12, 13, and 14, an operation may be performed according to the corresponding control command.

A block diagram of the second display device 12, a block diagram of the third display device 13, and a block diagram of the fourth display device 14 and the block diagram of the first display device 11 described in conjunction with FIG. 10 may be substantially identical to each other, and descriptions of the block diagram of the second to fourth display devices 12, 13, and 14 will be omitted.

Figure 11:
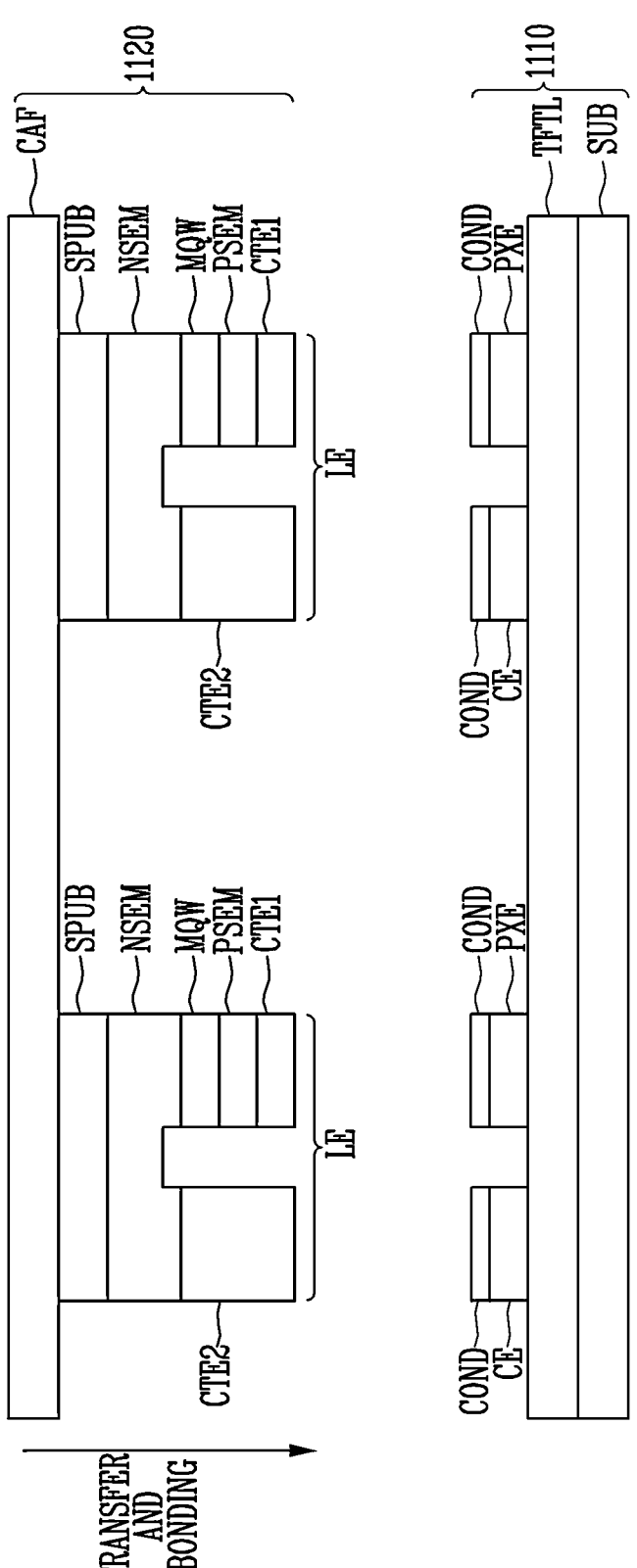
FIG. 11 is a schematic view illustrating a transfer process of a light emitting element.

FIG. 11 is a schematic view illustrating a transfer process of a light emitting element LE.

Referring to FIG. 11, a thin film transistor substrate 1110 and a transfer substrate 1120 transferred to the thin film transistor substrate 1110 are illustrated.

Referring to FIG. 11, the thin film transistor substrate 1110 may include a substrate SUB, a thin film transistor layer TFTL formed on the substrate SUB, and a common electrode CE and a pixel electrode PXE, which are formed on the thin film transistor layer TFTL.

The transfer substrate 1120 may include multiple light emitting elements LE and a carrier substrate CAF that transplants the light emitting element LE to the thin film transistor substrate 1110. A process of transplanting the light emitting elements LE to the thin film transistor substrate 1110 is referred to as a transfer process.

In order to transfer multiple light emitting elements LE on the thin film transistor substrate 1110 in one transfer process, the transfer substrate 1120 may further include the carrier substrate CAF which the light emitting elements LE are attached to and separated from. In an embodiment, the carrier substrate CAF may be a carrier substrate (or a carrier film) including the above-described polymer material having elasticity, such as PDMS, silicon, or the like, but the disclosure is not limited thereto.

The carrier substrate CAF may be attached to a base substrate SPUB of the light emitting element LE. The carrier substrate CAF may be detached from the base substrate SPUB and be removed after a transfer process is completed.

The light emitting element LE may be an inorganic light emitting element. The light emitting element LE may be a micro light emitting diode (LED) or the like. The light emitting elements LE may be transferred in one transfer process by the carrier substrate CAF.

In order to achieve electrical connection between the light emitting element LE, and the common electrode CE and the pixel electrode PXE, a bonding process may be performed after the transfer process. Through the bonding process, an electrical resistance between the light emitting element LE and the common electrode CE may be reduced, or an electrical resistance between the light emitting element LE and the pixel electrode PXE may be reduced.

Referring to FIG. 11, the thin film transistor substrate 1110 may further include a conductive material COND disposed on the pixel electrode PXE and the common electrode CE.

The conductive material COND may be a component for increasing adhesion between the pixel electrode PXE and the common electrode CE, and the light emitting element LE. The conductive material COND may be a component for reducing the electrical resistance between the pixel electrode PXE and the common electrode CE, and the light emitting element LE. However, in an embodiment, the conductive material COND may be omitted according to a bonding method.

The conductive material COND may be, for example, an Anisotropic Conductive Film (ACF), an Anisotropic Conductive Paste (ACP), the like, or a combination thereof. The conductive material COND may include, for example, a metallic conductive ball (not shown) having a conductivity, or the like. The conductive material COND may be applied with pressure, heat, and/or the like and have a conductivity. However, the conductive material COND is not limited thereto.

Referring to FIG. 11, it is illustrated that the conductive material COND is disposed on both the pixel electrode PXE and the common electrode CE. However, the disclosure is not limited thereto, and the conductive material COND may be disposed on only the pixel electrode PXE or be disposed on only the common electrode CE. In an embodiment, thicknesses of the conductive materials COND disposed on the pixel electrode PXE and the common electrode CE may be different from each other.

Through the transfer process and the bonding process, which are described above, multiple light emitting elements LE may be transferred on the thin film transistor substrate 1110.

Figure 12:
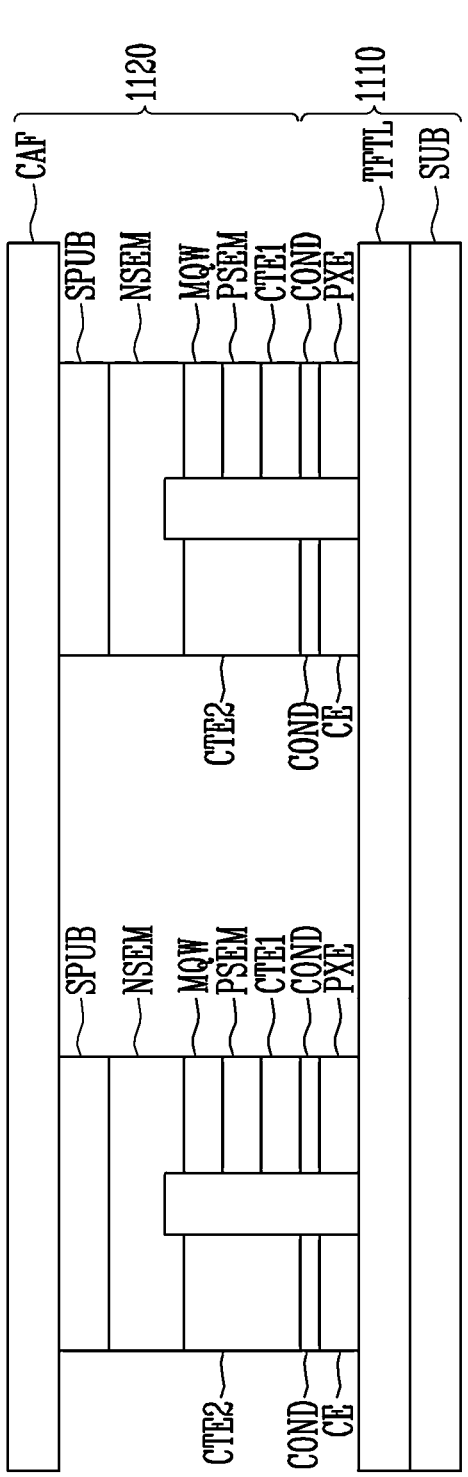
FIG. 12 is a schematic view illustrating a backplane substrate to which the light emitting element is transferred.

FIG. 12 is a schematic view illustrating a backplane substrate 1200 to which the light emitting element LE is transferred.

Referring to FIG. 12, the backplane substrate 1200 may include a thin film transistor substrate 1110 and a transfer substrate 1120.

The backplane substrate 1200 of FIG. 12 may be in a state multiple light emitting elements LE (see, e.g., FIG. 11) attached to a carrier substrate CAF are transferred on the thin film transistor substrate 1110.

The backplane substrate 1200 may further include a mother substrate (not shown). After both a transfer process and a bonding process are performed, the mother substrate may be separated from a substrate SUB (e.g., a bottom surface of the substrate SUB) and be removed. The mother substrate may be, for example, a rigid substrate including glass or the like, or be, for example, a flexible substrate including plastic or the like.

The backplane substrate 1200 may include, for example, a substrate SUB for forming a display device 10 (see, e.g., FIG. 1).

The backplane substrate 1200 may include, for example, a substrate SUB on which two or more display devices 10 (see, e.g., FIG. 1) are formed. After the transfer process and the bonding process on the backplane substrate 1200 are completed, a scribing process of cutting the substrate SUB may be performed. The two or more display devices 10 may be individually divided by the scribing process. A scribing line along which the substrate SUB is cut may be physically marked on the substrate SUB, but the disclosure is not limited thereto. The light emitting element LE (see, e.g., FIG. 11) may not be transferred to the scribing line along which the substrate SUB is cut. Also, the light emitting element LE may not be bonded to the scribing line.

The backplane substrate 1200 may include, for example, a substrate SUB for forming multiple display devices 11, 12, 13, and 14 (see, e.g., FIG. 5) constituting a tiled display device TLD (see, e.g., FIG. 5). An area in which multiple pads PAD (see, e.g., FIG. 9) are disposed on the substrate SUB or an area in which a side line SCL (see, e.g., FIG. 9) is disposed may be an area in which the light emitting element LE is not transferred or be an area in which the light emitting element LE is not bonded.

Figure 13:
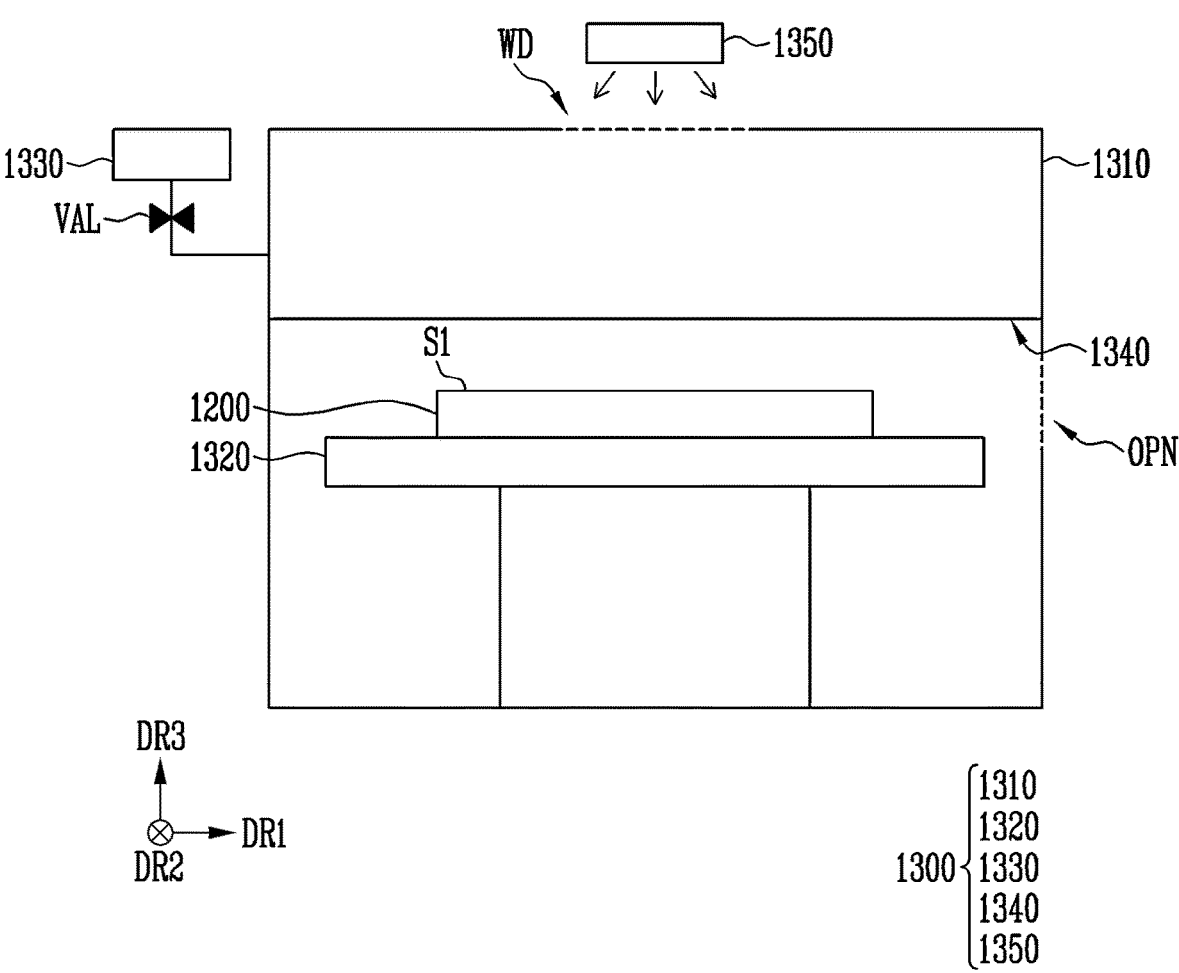
FIG. 13 is a schematic view illustrating a bonding device in accordance with embodiments of the disclosure.

FIG. 13 is a schematic view illustrating a bonding device 1300 in accordance with embodiments of the disclosure.

Referring to FIG. 13, the bonding device 1300 in accordance with embodiments of the disclosure may include a chamber 1310, a stage 1320, a pressurization source 1330, a pressurizing member 1340, a heat source 1350, and the like.

The chamber 1310 may provide a space in which a bonding process is performed. The chamber 1310 may include an opening OPN. A backplane substrate 1200 may be carried through the opening OPN. The opening OPN may be opened or closed. The carried backplane substrate 1200 may be located on the stage 1320 disposed in the chamber 1310. The chamber 1310 may include a window WD. The window WD may have light transmissivity. Light, heat, or energy emitted from the heat source 1350 through the window WD may be irradiated onto the backplane substrate 1200. Heat may be applied to the backplane substrate 1200 by the light irradiated onto the backplane substrate 1200. Accordingly, heat necessary for the bonding process may be provided.

The backplane substrate 1200 may be mounted on the stage 1320. The backplane substrate 1200 may be carried through the opening OPN and be mounted on the stage 1320. The stage 1320 may have a flat plate shape, but the disclosure is not limited thereto.

The pressurization source 1330 may apply pressure to the pressurizing member 1340. In an embodiment, the pressurization source 1330 may inject a gas (e.g., an air) into the chamber 1310, and the pressurizing member 1340 may be swelled by the gas injected into the chamber 1310.

The gas injected by the pressurization source 1330 may include, for example, an inert gas having a low reactivity, but the disclosure is not limited thereto. As the pressurization source 1330 injects the gas into the chamber 1310, the air pressure in the chamber 1310 surrounded by the pressurizing member 1340 may become higher than atmospheric pressure. In an embodiment, the gas injected into the chamber 1310 may be exhausted through an air exhaust hole (not shown) provided in the chamber 1310. In an embodiment, at least a portion of the window WD may be opened such that air injected into the chamber 1310 is exhausted. The pressurization source 1330 may include a valve VAL. As the valve VAL is opened or closed, the gas may be injected into the chamber 1310, or may not be injected into the chamber 1310.

The pressurizing member 1340 may apply pressure to the backplane substrate 1200 disposed on the stage 1320 (e.g., the stage 1320 and the backplane substrate 1200 disposed on the stage 1320). The pressurizing member 1340 may be formed of a material having an elasticity. For example, the pressurizing member 1340 may include a rubber material, a plastic material (e.g., polyimide) having flexibility, or the like, but the disclosure is not limited thereto. The pressurizing member 1340 may be swelled by the gas injected by the pressurization source 1330. The pressurizing member 1340 may contact a top surface (or a front surface) S1 of the backplane substrate 1200. The top surface S1 of the backplane substrate 1200 may be applied with pressure by the pressurizing member 1340, and the pressure may be applied to a light emitting element LE (see, e.g., FIG. 11) disposed on the top surface S1 of the backplane substrate 1200. Accordingly, the pressure may be applied to the light emitting element LE in the bonding process. The pressurizing member 1340 may have light transmissivity (e.g., light transmissivity with respect to light in a wavelength band, which is irradiated from the heat source 1350). Accordingly, at least a portion of the light irradiated from the heat source 1350 may be provided to the backplane substrate 1200 while passing through the pressurizing member 1340.

The heat source 1350 may irradiate light. The light irradiated from the heat source 1350 may be incident into the chamber 1310 through the window WD of the chamber 1310. The light irradiated from the heat source 1350 may be incident onto the top surface S1 of the backplane substrate 1200, and heat may be applied to the light emitting element LE (see, e.g., FIG. 11) in the bonding process. The heat source 1350 may irradiate infrared light having a wavelength band higher than a wavelength band of visible light, but the disclosure is not limited thereto.

Figure 14:
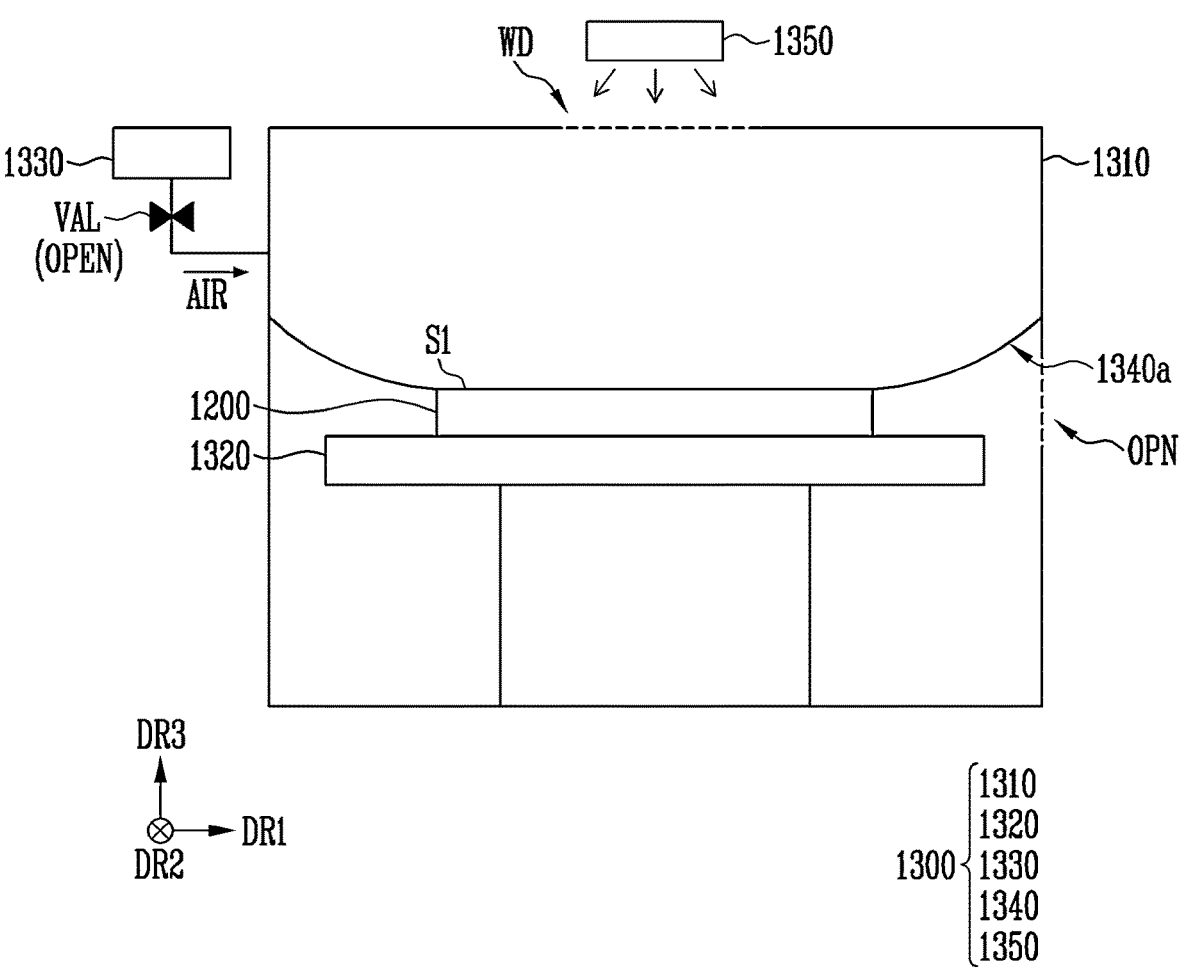
FIG. 14 is a schematic view illustrating a state in which the bonding device of FIG. 13 pressurizes the backplane substrate.

FIG. 14 is a schematic view illustrating a state in which the bonding device 1300 of FIG. 13 pressurizes the backplane substrate 1200.

FIG. 14 illustrates in which air AIR is injected into the chamber 1310 as the valve VAL of the pressurization source 1330 is opened. A swelled pressurizing member 1340a may apply pressure to the top surface S1 of the backplane substrate 1200. The heat source 1350 may provide heat to the top surface S1 of the backplane substrate 1200.

The swelled pressurizing member 1340a may provide pressure (e.g., uniform pressure) to the top surface S1 of the backplane substrate 1200. For example, uniform pressure may be provided to multiple light emitting elements LE (see, e.g., FIG. 11) disposed on the top surface S1 of the backplane substrate 1200. However, since a size of the light emitting element LE is very small, it may be difficult to precisely identify the pressure applied to the top surface S1 of the backplane substrate 1200. Therefore, a plan for solving this is required.

Figure 15:
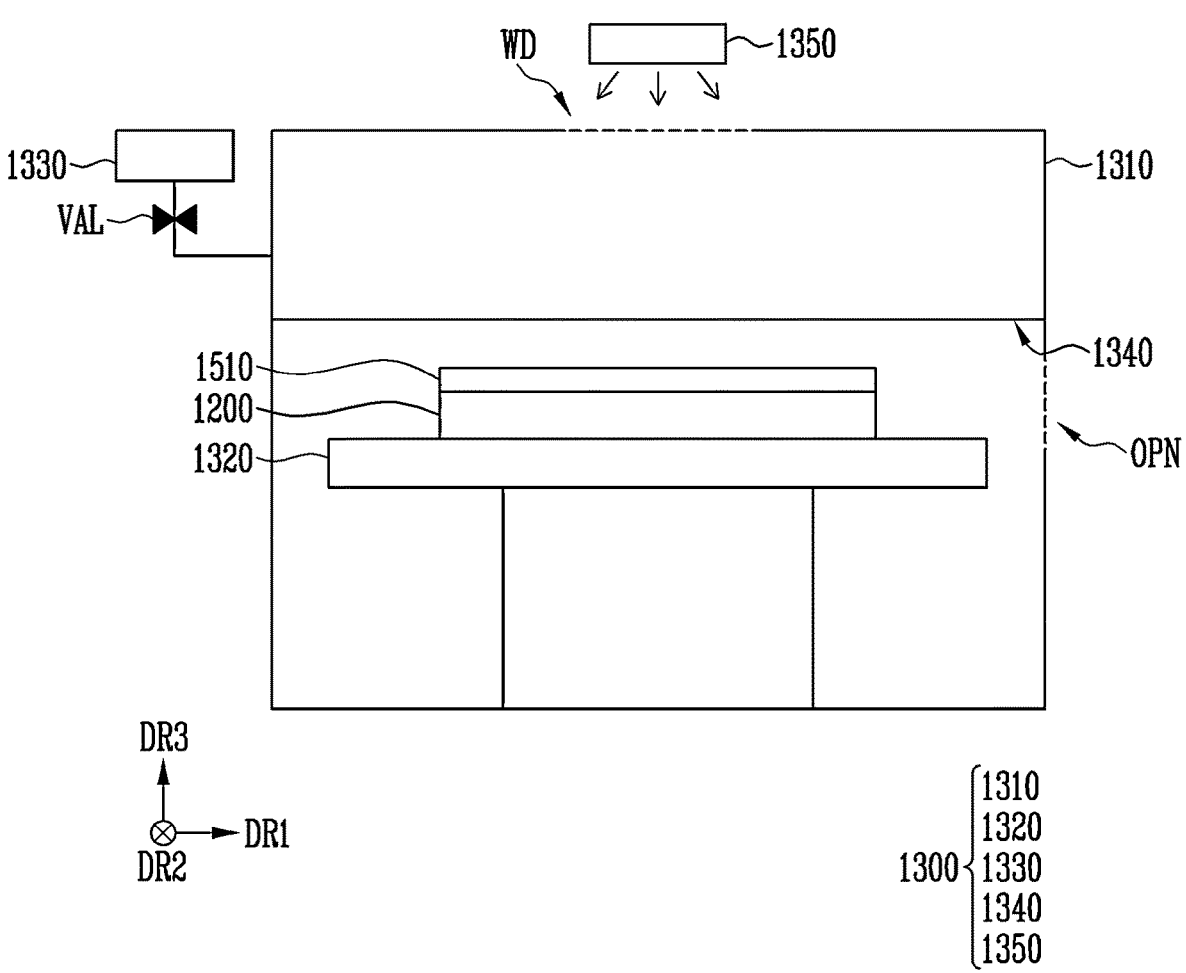
FIG. 15 is a schematic view illustrating a state in which a pressure detection sheet is disposed in the bonding device of FIG. 13 in accordance with embodiments of the disclo-sure.
Figure 16:
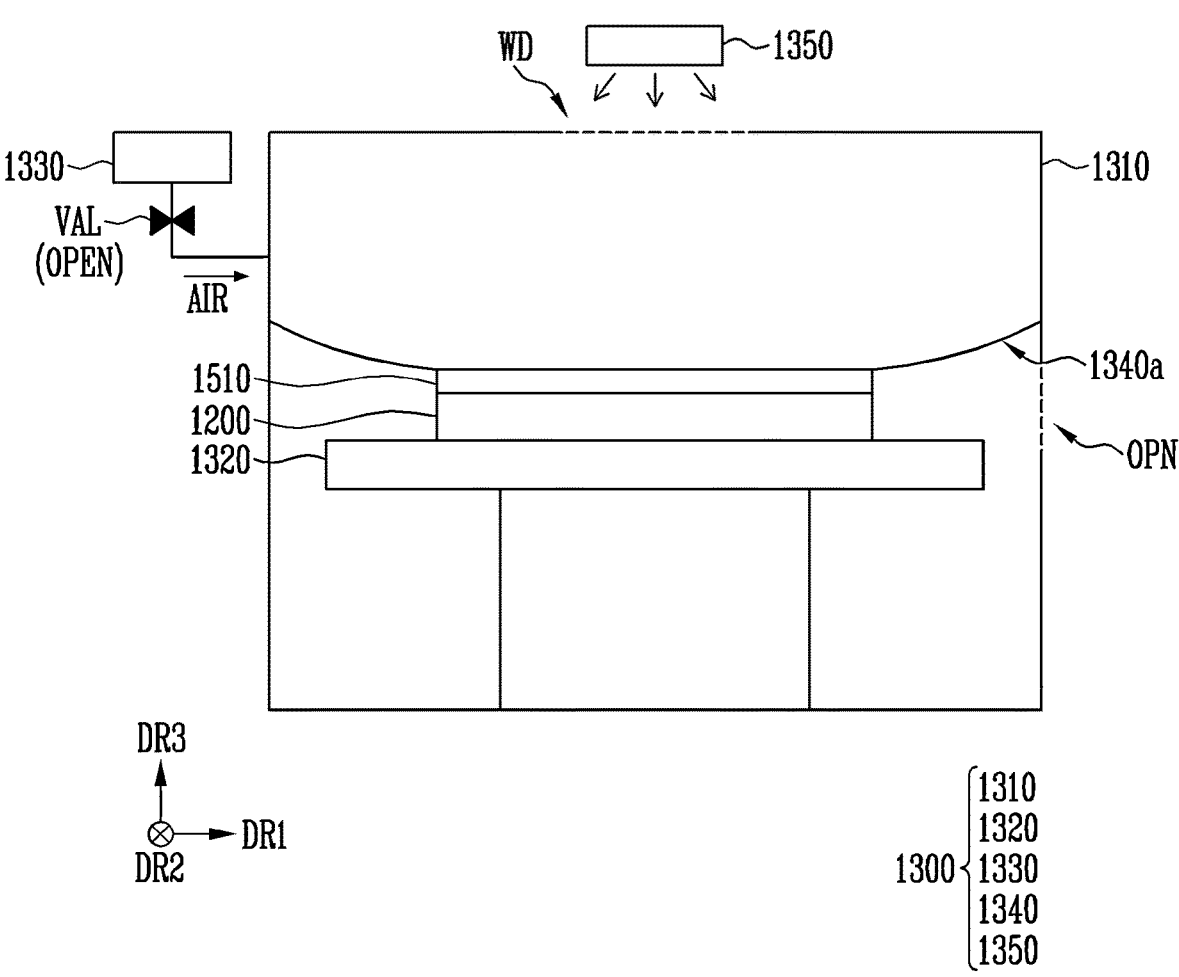
FIG. 16 is a schematic view illustrating a state in which the bonding device of FIG. 15 pressurizes the pressure detection sheet and the backplane substrate.

FIG. 15 is a schematic view illustrating a state in which a pressure detection sheet 1510 is disposed in the bonding device 1300 of FIG. 13 in accordance with embodiments of the disclosure. FIG. 16 is a schematic view illustrating a state in which the bonding device 1300 of FIG. 15 pressurizes the pressure detection sheet 1510 and the backplane substrate 1200.

Comparing FIG. 15 with FIG. 13, the pressure detection sheet 1510 may be disposed on the backplane substrate 120.

The pressure detection sheet 1510 may include a color capsule (not shown) and a color developer (not shown). The color capsule may include a color component. The color capsule may burst in case that a pressure is applied. The color developer may exhibit a color in case that it is mixed with the color component.

An area of the pressure detection sheet 1510 (e.g., an area of a bottom surface of the pressure detection sheet 1510) may be equal (e.g., substantially equal) to an area of the backplane substrate 1200 (e.g., an area of the top surface of the backplane substrate 1200), but the disclosure is not limited thereto.

The pressure detection sheet 1510 may be disposed on the carrier substrate CAF (see, e.g., FIG. 11). For example, in case that multiple light emitting elements LE (see, e.g., FIG. 11) are transferred from the carrier substrate CAF, the pressure detection sheet 1510 may be disposed on the carrier substrate CAF. In an embodiment, the pressure detection sheet 1510 may be disposed (e.g., disposed directly) on the light emitting element LE in a state in which the carrier substrate CAF is removed. In an embodiment, a protective film (not shown) for protecting the light emitting element LE may be interposed between the light emitting element LE and the pressure detection sheet 1510.

In an embodiment, in case that the light emitting elements LE (see, e.g., FIG. 11) are transferred (e.g., directly transferred) on the thin film transistor substrate 1110 without using the carrier substrate, the pressure detection sheet 1510 may be disposed (e.g., directly disposed) on the light emitting element LE. In an embodiment, a protective film (not shown) for protecting the light emitting element LE may be interposed between the light emitting element LE and the pressure detection sheet 1510.

Comparing FIG. 16 with FIG. 14, the pressure detection sheet 1510 may be interposed between the backplane substrate 1200 and the pressurizing member 1340. The pressurizing member 1340a may press a top surface (or front surface) of the pressure detection sheet 1510.

Pressures applied on areas of the backplane substrate 1200 by the pressurizing member 1240 may be different from each other due to a tolerance of the bonding device 1300. For example, a higher pressure may be applied to an area of the backplane substrate 1200, but a lower pressure may be applied to another area of the backplane substrate 1200. Due to a pressure difference between two areas, a larger number of color capsules of the pressure detection sheet 1510 may burst in the area to which a higher pressure is applied, and a smaller number of color capsules of the pressure detection sheet 1510 may burst in the area to which a lower pressure is applied. A chromogenic area may be formed in the area in which the color capsule of the pressure detection sheet 1510 bursts. For the above-described reason (e.g., a pressure difference between different areas), chromogenic areas having different sizes (or areas) may be formed in the pressure detection sheet 1510.

For the above-described reason (e.g., the pressure difference between different areas), a size (or an area) of the chromogenic area may be identified in the pressure detection sheet 1510, thereby detect whether the backplane substrate 1200 is applied with uniform pressure by the bonding device 1300. For example, it may be seen that, in case that the size of the chromogenic area is uniform in the pressure detection sheet 1510, the backplane substrate 1200 is applied with uniform pressure by the bonding device 1300. For example, it may be seen that, in case that a difference between sizes of chromogenic areas is large between areas of the pressure detection sheet 1510, the backplane substrate 1200 is applied with non-uniform pressure by the bonding device 1300.

Figure 17:
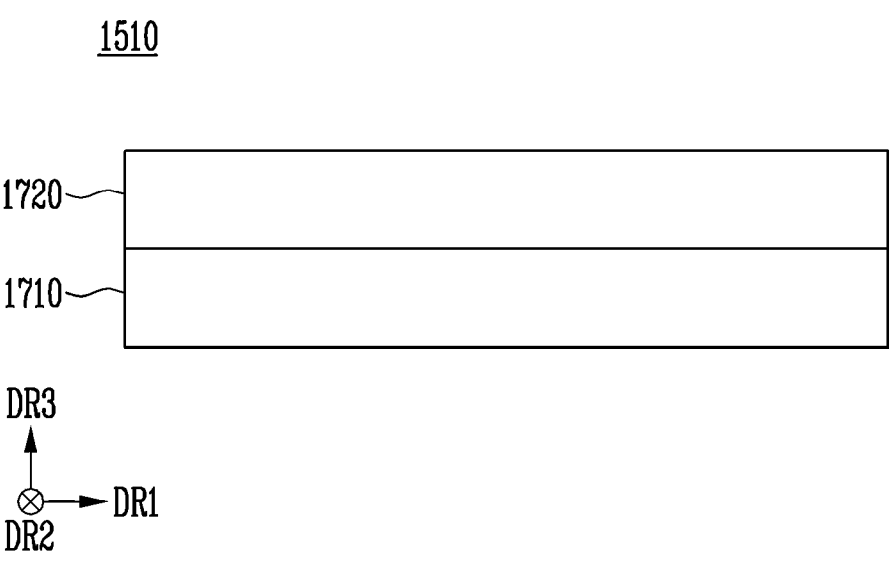
FIG. 17 is a schematic view illustrating a pressure detec-tion sheet in accordance with embodiments of the disclo-sure.

FIG. 17 is a schematic view illustrating a pressure detection sheet 1510 in accordance with embodiments of the disclosure.

The pressure detection sheet 1510 may include a first sheet 1710 and a second sheet 1720. The first sheet 1710 and the second sheet 1720 may overlap with each other in a vertical direction (e.g., the third direction DR3). Areas of the first sheet 1710 and the second sheet 1720 may be equal to each other in a plan view, but the disclosure is not limited thereto.

One (e.g., the first sheet 1710) of the first sheet 1710 and the second sheet 1720 may include a color capsule (not shown). Another one (e.g., the second sheet 1720) of the first sheet 1710 and the second sheet 1720 may include a color developer (not shown). Hereinafter, it is assumed and described that the first sheet 1710 includes a color capsule and the second sheet 1720 includes a color developer. However, the disclosure is not limited thereto.

Figure 18:
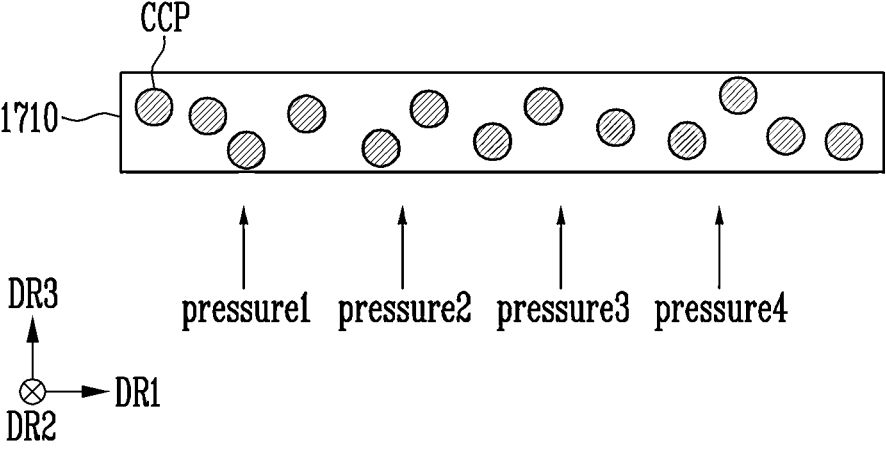
FIG. 18 is a schematic view illustrating a first sheet of the pressure detection sheet.

FIG. 18 is a schematic view illustrating the first sheet 1710 of the pressure detection sheet 1510 (see, e.g., 17).

Referring to FIG. 18, the first sheet 1710 may include color capsules CCP. A diameter (e.g., an average diameter) (or a size (e.g., an average size)) of the color capsules CCP may be in a range of about 10 μm to about 40 μm, but the disclosure is not limited thereto.

In the first sheet 1710, a range of about 5,000 to about 30,000 color capsules CCP may be averagely disposed within an area of about 2 cm×2 cm, but the disclosure is not limited thereto. The color capsules CCP may be dispersed (e.g., evenly dispersed) in the first sheet 1710.

In an embodiment, the color capsule CCP may include an electron-donating colorless dye precursor (not shown). The color developer (of the second sheet 1720) may include an electron-accepting compound (not shown) for color-developing the electron-donating colorless dye precursor. Accordingly, in case that the color capsule CCP releases the electron-donating colorless dye precursor while bursting due to pressure, the electron-accepting compound of the color developer may be color-developed while being combined with the electron-donating colorless dye precursor.

Referring to FIG. 18, it is illustrated that a force is applied at different places (e.g., four places) of a surface of the first sheet 1710. The four places may respectively correspond to first, second, third, and fourth pressures pressure 1, pressure 2, pressure 3, and pressure 4. The first to fourth pressures pressure 1, pressure 2, pressure 3, and pressure 4 may correspond to the pressures with which the backplane substrate 1200 is pressurized from the bonding device 1300 (e.g., the pressurizing member 1340).

Figure 19:
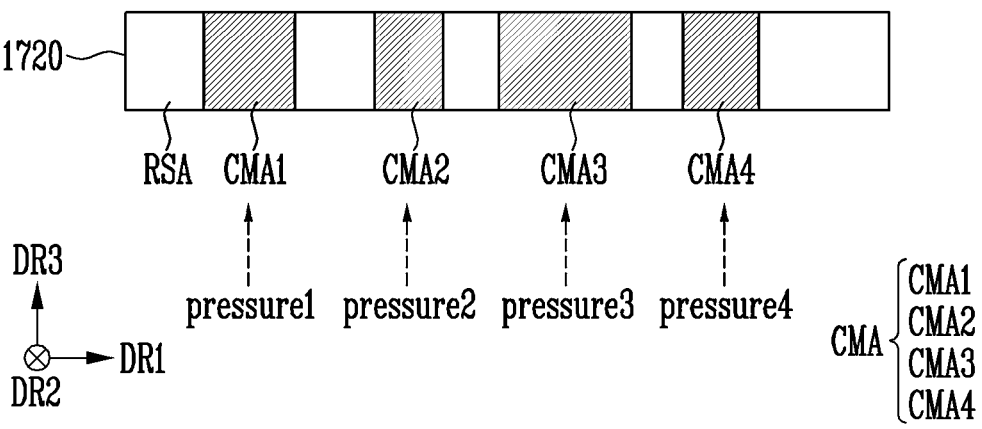
FIG. 19 is a schematic view illustrating a second sheet of the pressure detection sheet.

FIG. 19 is a schematic view illustrating the second sheet 1720 of the pressure detection sheet 1510 (see, e.g., 17).

The second sheet 1720 may include a color developer (not shown), and the color developer may include, for example, an electron-accepting compound. The electron-accepting compound may be combined with an electron-donating colorless dye precursor and form a color developing area CMA.

The second sheet 1720 may form a color developing area CMA and a peripheral area RSA at the periphery of the color developing area CMA. The color developing area CMA may include a first color developing area CMA1, a second color developing area CMA2, a third color developing area CMA3, and a fourth color developing area CMA4, which correspond to areas to which the first to fourth pressures pressure 1, pressure 2, pressure 3, and pressure 4 are applied.

Each of the first to fourth color developing areas CMA1, CMA2, CMA3, and CMA4 may correspond to the light emitting element LE (see, e.g., FIG. 11). Sizes (or widths) of the first to fourth color developing areas CMA1, CMA2, CMA3, and CMA4 may correspond to sizes of the first to fourth pressures pressure 1, pressure 2, pressure 3, and pressure 4.

The second sheet 1720 may be formed of a material having elasticity. For example, the area of the second sheet 1720 may be increased as corners of the second sheet 1720, which face each other, are pulled. Accordingly, an area of the color developing area CMA may be increased, and the first to fourth color developing areas CMA1, CMA2, CMA3, and CMA4 may be readily distinguished from each other.

Figure 20:
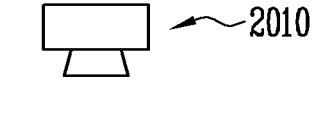
FIG. 20 is a schematic view illustrating a state in which the pressure detection sheet is photographed using an image capturing device.
Figure 20:
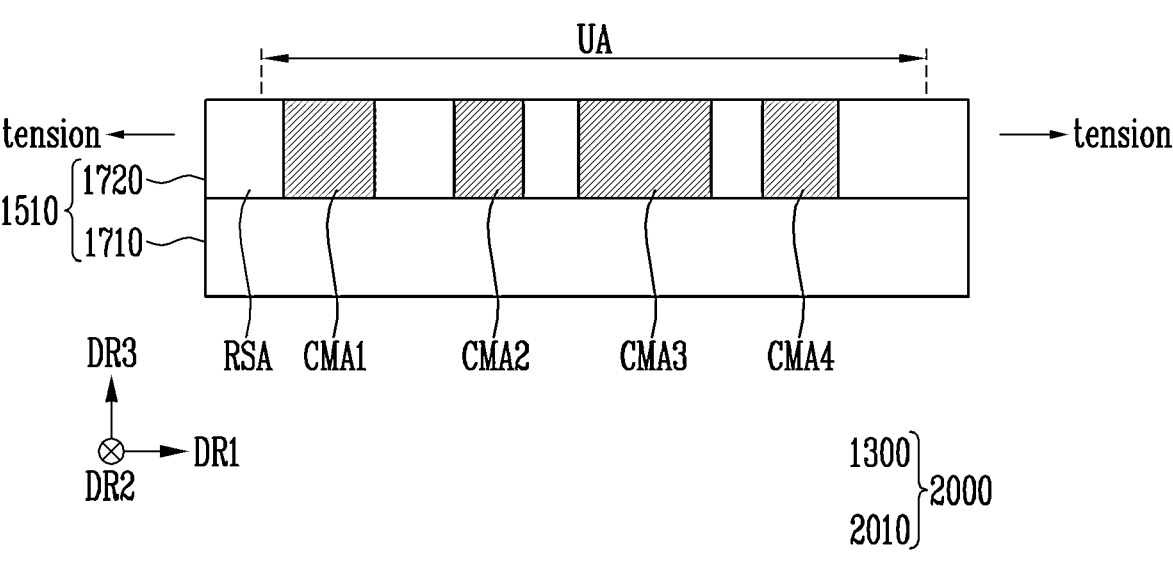

FIG. 20 is a schematic view illustrating a state in which the pressure detection sheet 1510 is photographed using an image capturing device 2010.

The image capturing device 2010 and the bonding device 1300 may constitute a bonding system 2000.

Referring to FIG. 20, the image capturing device 2010 may photograph (or capture) a surface of the pressure detection sheet 1510 (e.g., the top surface of the pressure detection sheet 1510). For example, the image capturing device 2010 may photograph a surface of the second sheet 1720 (e.g., a top surface of the second sheet 1720).

Referring to FIG. 20, the first sheet 1710 may be attached to another surface of the second sheet 1720 (e.g., a bottom surface of the second sheet 1720) while the surface of the second sheet 1720 is photographed by the image capturing device 2010. However, the disclosure is not limited thereto, and the first sheet 1710 may be separated from the another surface of the second sheet 1720 before the surface of the second sheet 1720 is photographed by the image capturing device 2010. Accordingly, a process in which the image capturing device 2010 photographs the pressure detection sheet 1510 may include a process of separating the first sheet 1710 and the second sheet 1720 from each other and a process of photographing a surface of the pressure detection sheet 1510 (e.g., a surface of the second sheet 1720).

The pressure detection sheet 1510 may be photographed by the image capturing device 2010 in a state in which a force for pulling the pressure detection sheet 1510 is applied at two sides of the pressure detection sheet 1510, which face each other. For example, a side of the pressure detection sheet 1510, which is located in the first direction DR1, may be pulled in the first direction DR1, and a side of the pressure detection sheet 1510, which is located in the opposite direction of the first direction DR1, may be pulled in the opposite direction of the first direction DR1. The image capturing device 2010 may photograph the pressure detection sheet 1510 in which the two sides are pulled.

In an embodiment, the pressure detection sheet 1510 may be photographed by the image capturing device 2010 in a state in which a force for pulling the pressure detection sheet 1510 is applied at four or more sides of the pressure detection sheet 1510, which face each other. For example, a side of the pressure detection sheet 1510, which is located in the first direction DR1, may be pulled in the first direction DR1, a side of the pressure detection sheet 1510, which is located in the opposite direction of the first direction DR1, may be pulled in the opposite direction of the first direction DR1, a side of the pressure detection sheet 1510, which is located in the second direction DR2, may be pulled in the second direction DR2, and a side of the pressure detection sheet 1510, which is located in the opposite direction of the second direction DR2 may be pulled in the opposite direction of the second direction DR2. The image capturing device 2010 may photograph the pressure detection sheet 1510 in which the four or more sides are pulled.

The image capturing device 2010 may acquire an image of an area (e.g., a unit area) UA (e.g., an image of an area UA, or an image of a predetermined or selectable area UA). The image capturing device 2010 may include a microscope (not shown) that acquires an enlarged image of the area UA. A resolution power of the image capturing device 2010 may be less than or equal to about 2 μm. For example, in case that a magnification of the image capturing device 2010 is set to about 500 times, a resolution of the image capturing device 2010 may be equal to or greater than about 300,000 pixels. The kind of the microscope is not limited.

The first to fourth color developing areas CMA1, CMA2, CMA3, and CMA4 may be distinguished from each other, based on an image acquired by the image capturing device 2010. Sizes of the first to fourth color developing areas CMA1, CMA2, CMA3, and CMA4 may be detected (or compared with each other). Based on the sizes of the first to fourth color developing areas CMA1, CMA2, CMA3, and CMA4, it may be decided whether a pressure applied to the light emitting element in performance of the bonding process is within a range (e.g., an appropriate range).

FIGS. 21 to 25 are schematic views illustrating a method of detecting an area of the color developing area CMA in the photographed pressure detection sheet 1510 (see, e.g., 17).

FIGS. 21 to 25 schematically illustrate a method of detecting an area of the color developing area CMA, based on an image obtained by photographing the top surface of the pressure detection sheet 1510, for example, the top surface of the second sheet 1720. However, the disclosure is not limited thereto, and in an embodiment, the area of the color developing area CMA may be detected based on an image obtained by photographing the bottom surface of the pressure detection sheet 1510, for example, the bottom surface of the second sheet 1720.

Referring to FIGS. 21 to 25, a method of detecting the area of the color developing area CMA may include step S2100 of acquiring an image of an area corresponding to the area UA, step S2200 of detecting a color developing area CMA and a peripheral area RSA, step S2300 of coloring the color developing area CMA, step S2400 of setting a detection pixel SSP, step S2500 of detecting a number of color pixels CMP, and the like.

Figure 21:
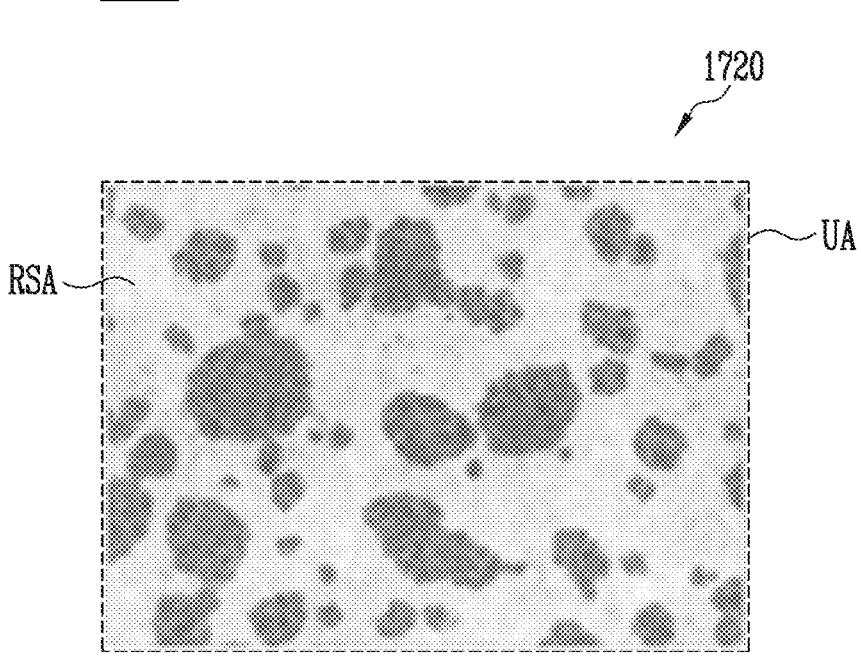
FIGS. 21 to 25 are schematic views illustrating a method of detecting an area of a color developing area in the photographed pressure detection sheet.

Referring to FIG. 21, step S2100 of the acquiring of an image of the area corresponding to the area UA is illustrated.

The image may be an image corresponding to the area UA set in FIG. 20. The image corresponding to the area UA may be an image captured in a state in which the second sheet 1720 is pulled by applying a force to two or more sides of the second sheet 1720, which face each other.

An area illustrated lighter in the image shown in FIG. 21 may correspond to a peripheral area RSA. However, distinguishment between the peripheral area RSA and a color-developed area may be slightly unclear in the image in FIG. 21.

Figure 22:
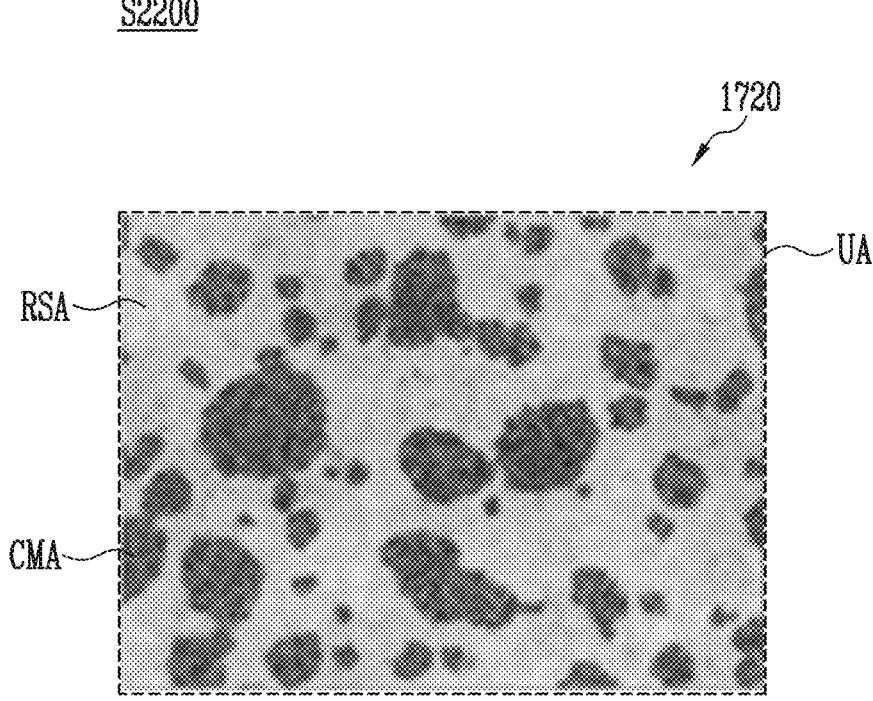

Referring to FIG. 22, step S2200 of the detecting of the color developing area CMA and the peripheral area RSA is illustrated.

In the step S2200 of the detecting of the color developing area CMA and the peripheral area RSA, an acquired color image may be transformed to a black-and-white image by performing binarization. The color developing area CMA and the peripheral area RSA may be distinguished from each other, based on a difference between grayscale values in the black-and-white image. For example, an area having a low grayscale value may correspond to the color developing area CMA, and an area having a high grayscale value may correspond to the peripheral area RSA.

Figure 23:
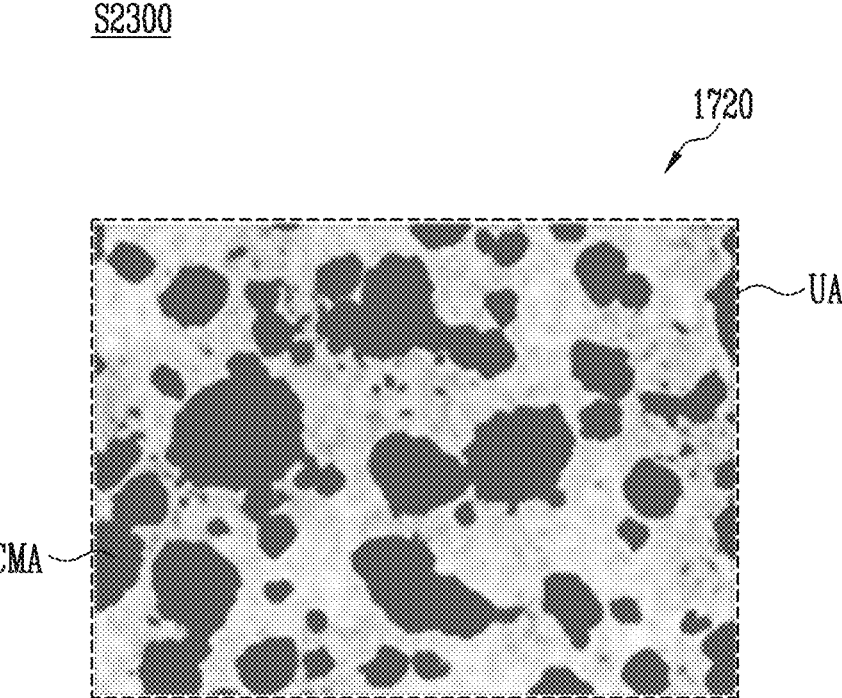

Referring to FIG. 23, step S2300 of the coloring of the color developing area CMA is illustrated.

In the step S2300 of the coloring of the color developing area CMA, a color may be given to an area detected as the color developing area CMA.

A number of color capsules described above in FIG. 19 may be selected by a person skilled in the art within a range to distinguish boundaries between color developing areas and peripheral areas.

Figure 24:
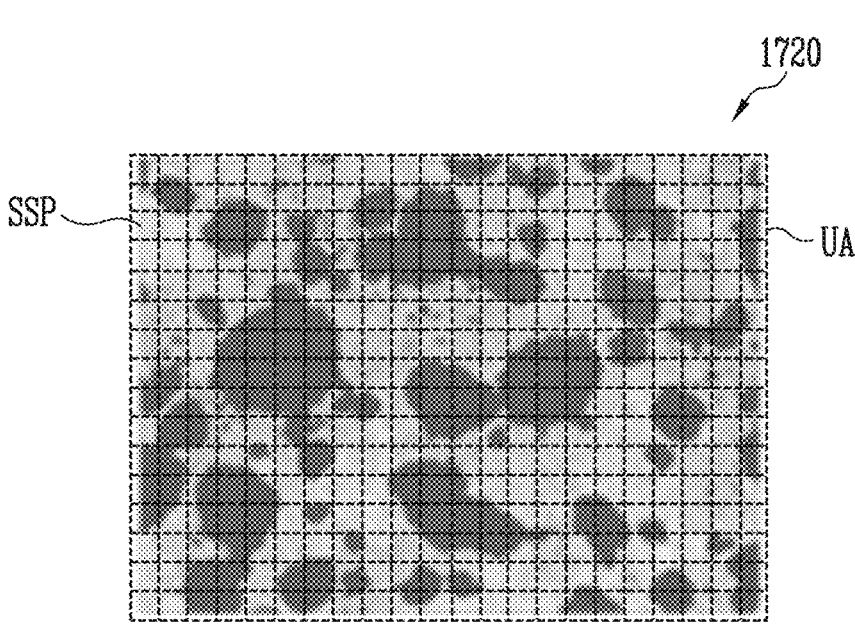

FIG. 24 illustrates step S2400 of the setting of the detection pixel SSP.

The detection pixel SSP may be set by splitting the area UA. The detection pixel SSP may be divided into a color pixel CMP (see, e.g., FIG. 25) and a residual pixel RSP (see, e.g., FIG. 25) according to a ratio of the color developing area CMA in the detection pixel SSP.

For example, in case that the ratio of the color developing area CMA in the detection pixel SSP is high (e.g., equal to or greater than a ratio, or equal to or greater than a predetermined or selectable ratio), the corresponding detection pixel SSP may be considered as the color pixel CMP. For example, in case that the ratio of the color developing area CMA in the detection pixel SSP is low (e.g., less than the ratio, or less than the predetermined ratio), the corresponding detection pixel SSP may be considered as the residual pixel RSP.

The ratio (e.g., the predetermined or selectable ratio) as a threshold value for dividing the detection pixel SSP into the color pixel CMP and the residual pixel RSP may be selected by a person skilled in the art. For example, the ratio (e.g., the predetermined or selectable ratio) may be set to about 10%, but the disclosure is not limited thereto.

Referring to FIG. 24, in an embodiment, the area UA may include 16 rows and 22 columns of detection pixels SSP of total of 352 detection pixels SSP. However, the disclosure is not limited thereto, and number and/or an arrangement of detection pixels SSP in the area UA may be freely set by a person skilled in the art.

Figure 25:
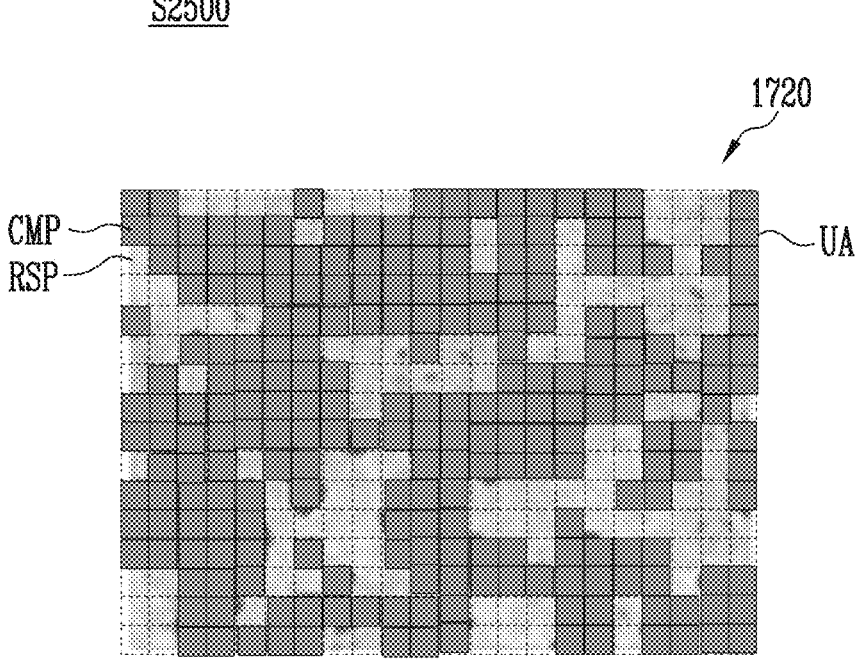

FIG. 25 illustrates the step S2500 of the detecting of a number of color pixels CMP.

Referring to FIG. 25, a detection pixel SSP (see. e.g., FIG. 24) in which the ratio of the color developing area CAM is high (e.g., equal to greater than the ratio, or equal to or greater than the predetermined or selectable ratio) may be the color pixel CMP. A detection pixel SSP in which the ratio of the color developing area CAM is low (e.g., less than the ratio, or less than the predetermined or selectable ratio) or 0 may be the residual pixel RSP.

Referring to FIG. 25, among the total of 352 detection pixels SSP, 232 pixels may be color pixels CMP, and the other pixels, i.e., 120 pixels may be residual pixels RSP. The ratio of color pixels CMP, i.e., the ratio of detection pixels SSP that is color pixels CMP may be calculated as about 232/352, which may be about 66%.

In the disclosure, two or more areas UA may be set in the pressure detection sheet 1510 (see, e.g., FIG. 20), and ratios of color pixels CMP between the unit areas UA may be compared with each other. Accordingly, it may be identified whether uniform pressure is applied to the pressure detection sheet 1510. It may be detected (e.g., directly detected) whether the backplane substrate 1200 (see, e.g., FIG. 15) is applied with uniform pressure by the bonding device 1300 (see, e.g., FIG. 15) (or the pressurizing member 1340).

In the pressure detection method, the pressure detection method of the bonding device 1300 using the pressure detection method, and the bonding system 2000 including the pressure detection method in accordance with the disclosure, it may be inspected whether uniform pressure is applied to a pressure detection sheet 1510.

In the pressure detection method, the pressure detection method of the bonding device using the pressure detection method, and the bonding system including the pressure detection method in accordance with the disclosure, it may be inspected whether uniform pressure is applied to transfer light emitting elements.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A pressure detection method of a bonding device, the pressure detection method comprising:
   forming a backplane substrate including a light emitting element;
   disposing a pressure detection sheet on the backplane substrate;
   transferring the backplane substrate and the pressure detection sheet into a chamber;
   bonding the light emitting element by pressurizing the pressure detection sheet;
   photographing the pressure detection sheet; and
   detecting a color developing area of the pressure detection sheet.

2. The pressure detection method of claim 1, wherein the photographing of the pressure detection sheet includes:
   applying a force to the pressure detection sheet in a direction to increase an area of the pressure detection sheet; and
   photographing the pressure detection sheet having the increased area.

3. The pressure detection method of claim 2, wherein in the applying of the force to the pressure detection sheet, the force is uniformly applied to sides of the pressure detection sheet, which face each other.

4. The pressure detection method of claim 1, wherein the photographing of the pressure detection sheet includes:
   setting an area of the pressure detection sheet; and
   photographing the area by using a microscope of which a resolution power is set to less than or equal to about 2 μm.

5. The pressure detection method of claim 4, wherein, in the photographing of the area by using the microscope of which the resolution power is set to less than or equal to about 2 μm, a magnification of the microscope is set to about 500 times, and a photographing resolution is equal to or greater than about 300,000 pixels.

6. The pressure detection method of claim 1, wherein the detecting of the color developing area includes:
   acquiring an image of an area of the pressure detection sheet;
   detecting, in the image, the color developing area color-developed by a color component and a peripheral area which is not color-developed;
   setting a plurality of detection pixels by splitting the image; and
   detecting a color pixel having a ratio of the color developing area equal to or greater than a predetermined ratio among the plurality of detection pixels.

7. The pressure detection method of claim 6, wherein the predetermined ratio is equal to or greater than about 10%.

8. The pressure detection method of claim 1, wherein the pressure detection sheet includes:
   a first sheet including a color capsule; and
   a second sheet including a color developer, and
   in the bonding of the light emitting element by pressurizing the pressure detection sheet, a color component of the color capsule is mixed with the color developer.

9. The pressure detection method of claim 8, wherein the photographing of the pressure detection sheet includes:

separating the first sheet and the second sheet from each other; and photographing a surface of the second sheet.

10. The pressure detection method of claim 1, wherein the forming of the backplane substrate includes:

disposing a thin film transistor substrate; and transferring the light emitting element on the thin film transistor substrate.

11. The pressure detection method of claim 10, wherein the forming of the backplane substrate further includes disposing a conductive material on the thin film transistor substrate.

12. The pressure detection method of claim 10, wherein the transferring of the light emitting element includes:

providing a carrier substrate including the light emitting element; and transferring the carrier substrate including the light emitting element to the backplane substrate.

13. The pressure detection method of claim 1, wherein the light emitting element is a micro light emitting diode.

14. A bonding system comprising:

a chamber having a space;

a stage located in the chamber, the stage on which a backplane substrate including a light emitting element is mounted, a pressure detection sheet disposed on the light emitting element of the backplane substrate;

a pressurizing member located in the chamber and pressurizing the pressure detection sheet;

a pressurization source supplying a gas into the chamber and providing air pressure to the pressurizing member; and an image capturing device photographing the pressure detection sheet and detecting a color developing area of the pressure detection sheet.

15. The bonding system of claim 14, further comprising:

a heat source irradiating light toward the stage.

16. The bonding system of claim 14, wherein the image capturing device includes a microscope with a resolution power set to less than or equal to about 2 μm.

17. The bonding system of claim 14, wherein the image capturing device:

acquires an image of an area of the pressure detection sheet;

detects, in the image, the color developing area color-developed by a color component and a peripheral area which is not color-developed;

sets a plurality of detection pixels by splitting the image; and detects color pixels having a ratio of the color developing area equal to or greater than a predetermined ratio among the plurality of detection pixels.

18. The bonding system of claim 14, wherein the backplane substrate further includes:

a thin film transistor substrate including the light emitting element and at least one transistor; and a conductive material interposed between the thin film transistor substrate and the light emitting element.

19. A pressure detection method comprising:

pressurizing a pressure detection sheet;

photographing the pressure detection sheet;

acquiring an image of an area of the pressure detection sheet;

detecting, in the image, a color developing area color-developed by a color component and a peripheral area which is not color-developed;

setting a plurality of detection pixels by splitting the image;

detecting a number of color pixels having a ratio of the color developing area equal to or greater than a predetermined ratio among the plurality of detection pixels; and detecting an area of the color developing area of the pressure detection sheet, based on the number of the color pixels.

20. The pressure detection method of claim 19, wherein the photographing of the pressure detection sheet includes:

applying a force to the pressure detection sheet in a direction to increase an area of the pressure detection sheet; and photographing the pressure detection sheet having the increased area.

* * * * *